(12) United States Patent
Yamada et al.

(10) Patent No.: US 8,105,524 B2
(45) Date of Patent: Jan. 31, 2012

(54) COMPRESSION MOLDING METHOD FOR ELECTRONIC COMPONENT AND COMPRESSION MOLDING APPARATUS EMPLOYED THEREFOR

(75) Inventors: Tetsuya Yamada, Kyoto (JP); Tomoyuki Gotoh, Kyoto (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 169 days.

(21) Appl. No.: 12/303,504

(22) PCT Filed: Oct. 22, 2007

(86) PCT No.: PCT/JP2007/070542
§ 371 (c)(1),
(2), (4) Date: Dec. 4, 2008

(87) PCT Pub. No.: WO2008/053734
PCT Pub. Date: May 8, 2008

(65) Prior Publication Data
US 2009/0200704 A1 Aug. 13, 2009

(30) Foreign Application Priority Data
Nov. 2, 2006 (JP) ................. 2006-298330

(51) Int. Cl.
*B29C 45/14* (2006.01)
*B29B 13/00* (2006.01)
*A23G 1/22* (2006.01)

(52) U.S. Cl. ........... 264/272.11; 264/271.1; 264/272.13; 264/272.14; 264/272.15; 264/272.17; 425/121; 425/128

(58) Field of Classification Search ............... 264/272.1, 264/272.11, 272.13, 272.14, 272.15, 272.17, 264/271.1
See application file for complete search history.

(56) References Cited

U.S. PATENT DOCUMENTS

| 3,924,837 | A | * | 12/1975 | Knis et al. | ............... 366/98 |
| 5,635,115 | A | * | 6/1997 | Konishi et al. | .............. 264/1.7 |
| 5,672,549 | A | * | 9/1997 | Minami et al. | ............... 438/125 |
| 6,080,354 | A | * | 6/2000 | Miyajima | ............... 264/511 |
| 2006/0186576 | A1 | * | 8/2006 | Takase et al. | ............ 264/272.11 |
| 2006/0205237 | A1 | * | 9/2006 | Kodama et al. | .............. 438/790 |

FOREIGN PATENT DOCUMENTS
CN 1832839 A 9/2006
(Continued)

OTHER PUBLICATIONS

Nikkei Monozukuri, Published by Nikkei Business Publications, Heishin Robo Dispenser, Aug. 1, 2006, Japan.
(Continued)

*Primary Examiner* — Christina Johnson
*Assistant Examiner* — Atul P Khare
(74) *Attorney, Agent, or Firm* — Birch, Stewart, Kolasch & Birch, LLP

(57) ABSTRACT

First, a horizontal nozzle is inserted between an upper mold section and a lower mold section in a horizontally extending state. Then, liquid resin is horizontally discharged from a discharge port of the horizontal nozzle. Thus, the liquid resin is supplied into a cavity. Thereafter the upper mold section and the lower mold section are closed. Consequently, an electronic component mounted on a substrate is dipped in the liquid resin stored in the cavity. Therefore, the electronic component is resin-sealed on the substrate by compression molding.

6 Claims, 11 Drawing Sheets

FOREIGN PATENT DOCUMENTS

| | | | |
|---|---|---|---|
| JP | 5154428 A | 6/1993 |
| JP | 5237363 A | 9/1993 |
| JP | 5074412 B | 10/1993 |
| JP | 10-214853 A | 8/1998 |
| JP | 10-305439 A | 11/1998 |
| JP | 2003-165133 A | 6/2003 |
| JP | 2003165133 A | * | 6/2003 |
| JP | 2003165133 A | 6/2003 |
| JP | 2005-225133 A | 8/2005 |
| JP | 2006-131849 A | 5/2006 |
| JP | 2006123398 A | 5/2006 |
| KR | 10-0385285 B1 | 8/2003 |
| KR | 10-2006-0052812 A | 5/2006 |

OTHER PUBLICATIONS

Nikkei Monozukuri, Published by Nikkei Business Publications, Heishin Robo Dispenser, Mar. 1, 2006, Japan.

* cited by examiner

COMPRESSION MOLDING METHOD FOR ELECTRONIC COMPONENT AND COMPRESSION MOLDING APPARATUS EMPLOYED THEREFOR

TECHNICAL FIELD

The present invention relates to compression molding of an electronic component.

BACKGROUND ART

In general, electronic components are sealed with a resin material by a compression molding technique. In such compression molding, light-transmitting liquid resin such as silicone resin, for example, is employed. Thus, optical elements formed by LED (Light Emitting Diode) chips, for example, are sealed by compression molding.

In the compression molding, a compression molding apparatus shown in FIG. 18 is employed. This apparatus comprises a mold assembly 82 having an upper mold section 83, an intermediate mold section 84 and a lower mold section 85. In the compression molding employing this apparatus, light-transmitting liquid resin 87 such as silicone resin is supplied from a vertical dispenser 81 into a cavity 86 of mold assembly 82. Thus, a plurality of (e.g., eight) LED chips 89 mounted on a substrate 88 such as a lead frame are integrally sealed with resin by the compression molding.

The aforementioned compression molding method is now more specifically described.

First, vertical dispenser 81 is inserted between upper mold section 83 and lower mold section 85 of conventional mold assembly 82 for compression molding. At this time, lower mold section 85 is already covered with a mold releasing film 90. In this state, liquid resin 87 is dripped onto the middle position of cavity 86 of lower mold section 85 from a vertical nozzle 91 of vertical dispenser 81.

Then, lower mold section 85 and intermediate mold section 84 move toward upper mold section 83. At this time, substrate 88 is already set on upper mold section 83. Therefore, mold assembly 82 is closed while LED chips 89 mounted on substrate 88 are directed downward. Thus, LED chips 89 are immersed in liquid resin 87 stored in cavity 86.

After a lapse of a time necessary for curing liquid resin 87, mold assembly 82 is opened. Thus, the plurality of LED chips 89 are sealed in a resin molding corresponding to the shape of cavity 86. Consequently, a molding is completed. Thereafter the molding is cut along cutting plane lines. Thus, individual chip-type LEDs are completed.

While the aforementioned mold assembly 82 has the three-plate structure formed by upper mold section 83, intermediate mold section 84 and lower mold section 85, a mold assembly having a two-plate structure formed by an upper mold section and a lower mold section may also be employed.

However, the aforementioned conventional compression molding method disclosed in Japanese Patent Laying-Open No. 2003-165133, for example, leads to the following problems:

Patent Document 1: Japanese Patent Laying-Open No. 2003-165133 (refer to FIG. 2)

DISCLOSURE OF THE INVENTION

Problems to be Solved by the Invention

It has recently been required to reduce a space in a factory for setting the compression molding apparatus provided with mold assembly 82 and the like. In other words, downsizing of the compression molding apparatus is required.

As shown in FIG. 18, however, the distance 92 between the molding surfaces of mold assembly 82 must be increased to some extent, in order to insert vertical dispenser 81 between the molding surfaces of mold assembly 82. Thus, size of the compression molding apparatus is increased. In other words, the compression molding apparatus cannot be downsized.

As described above, liquid resin 87 is dripped onto the middle position of cavity 86 from vertical dispenser 81. Therefore, liquid resin 87 stored in cavity 86 gelates or is cured due to heating before a prescribed volume of liquid resin 87 is entirely supplied into cavity 86. In other words, flowability of liquid resin 87 is damaged. Consequently, liquid resin 87 cannot be homogeneously supplied to the entire cavity 86. For example, liquid resin 87 is convexly formed on cavity 86. In this case, such inconvenience results that unloaded portions are formed in LED moldings. Further, liquid resin 87 stored in cavity 86 may be so partially cured that cured resin 93 is formed in liquid resin 87. In this case, cured resin 93 may move in liquid resin 87. Therefore, cured rein 93 may deform or cut wires. Consequently, the yield of products is reduced.

The present invention has been proposed in consideration of the aforementioned problems, and an object thereof is to downsize a compression molding apparatus for an electronic component. Another object of the present invention is to improve the yield of moldings by homogeneously supplying liquid resin into a cavity.

Means for Solving the Problems

In a compression molding method for an electronic component according to the present invention, an upper mold section and a lower mold section provided with a cavity are first prepared. Then, liquid resin is discharged in the horizontal direction, so that the liquid resin falls into the cavity. Thereafter the upper mold section and the lower mold section are so closed that an electronic component loaded on a substrate mounted on the upper mold section is immersed in the liquid resin. Further, the upper mold section and the lower mold section are opened.

A compression molding apparatus according to an aspect of the present invention comprises a lower mold section provided with a cavity and an upper mold section opposed to the lower mold section so that a substrate loaded with an electronic component is mountable thereon. This apparatus further comprises a resin supply portion capable of supplying liquid resin into the cavity and a nozzle attached to the resin supply portion in a detachable manner and capable of discharging the liquid resin into the cavity.

A compression molding apparatus according to another aspect of the present invention comprises a lower mold section provided with a cavity and an upper mold section opposed to the lower mold section so that a substrate loaded with an electronic component is mountable thereon. This apparatus further comprises a resin supply mechanism capable of supplying liquid resin into the cavity and a moving mechanism capable of moving the resin supply mechanism to be capable of supplying the liquid resin into the cavity. The apparatus further comprises a charge portion chargeable with the liquid resin to be guided to the resin supply mechanism and a measuring portion measuring the liquid resin when the liquid resin is guided from the charge portion to the resin supply mechanism.

The foregoing and other objects, features, aspects and advantages of the present invention will become more appar-

Figure 1:
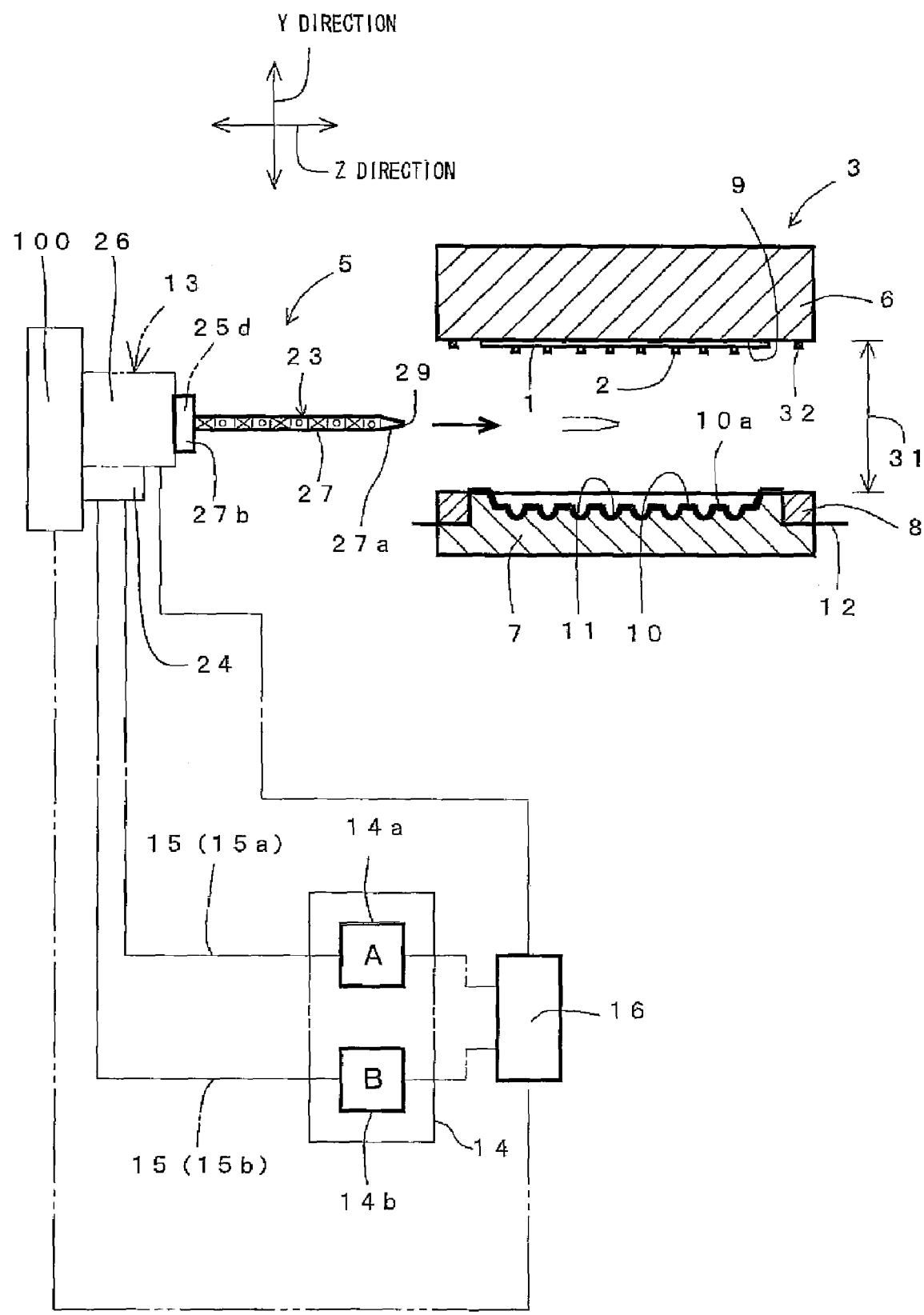
FIG. 1 is a sectional view schematically showing a compression molding apparatus according to an embodiment, illustrating a state before a resin supply mechanism is inserted between molding surfaces of a mold assembly.

DESCRIPTION OF THE REFERENCE SIGNS 1 substrate, 2 LED chip (optical element), 3 mold assembly, 4 liquid resin, 4a liquid resin (horizontal direction), 4b liquid resin (fall parabola), 5 resin supply mechanism, 6 upper mold section, 7 lower mold section, 8 intermediate mold section, 9 substrate supply portion, 10 cavity, 10a cavity surface (bottom surface of cavity), 11 individual cavity (LED cavity), 12 mold releasing film, 13 resin supply portion (body of resin supply mechanism), 14 cartridge charge portion (liquid resin charge portion), 14a A cartridge charge portion, 14b B cartridge charge portion, 15 transfer path 15a A transfer path, 15b B transfer path, 16 control portion, 17 cartridge, 17a A cartridge, 17b B cartridge, 18 cartridge charge portion body, 18a A cartridge charge portion body, 18b B cartridge charge portion body, 19 pressure mechanism, 19a A pressure mechanism, 19b B pressure mechanism, 20 cartridge body, 20a A cartridge body, 20b B cartridge body, 21 plunger, 21a A plunger, 21b B plunger, 22 sealing member (plunger) for preventing aeration, 22a A sealing member (plunger), 22b B sealing member (plunger), 23 horizontal nozzle, 24 measuring portion, 24a A measuring portion, 24b B measuring portion, 25 connecting pipe, 25a A pipe (A inlet), 25b B pipe (B inlet), 25c AB pipe (AB outlet), 25d nozzle mount portion, 25e storage portion, 26 rotational driving portion, 27 nozzle body, 27a nozzle forward end, 27b nozzle base end, 28 spiral supply member, 29 discharge port, 30 rod, 30a stop portion (of spiral supply member), 31 distance, 32 outside air cutoff member, 51 simultaneous transport mechanism, 52 body of simultaneous transport mechanism, 53 substrate supply mechanism, 54 substrate receiving portion, 55 substrate lifting portion, 56 pan portion, 57 distance, 61 resin supply mechanism, 62 resin supply portion, 63 (quantitative) measuring portion, 64 horizontal nozzle, 64a discharge port, 65 measuring nozzle portion, 66 driving portion, 67 rotor, 68 stator, 69 distance, 71 liquid resin charge portion (cartridge charge portion), 72 liquid resin charge portion body, 73 air cylinder (pressure mechanism), 73a piston (rod), 73b driving portion (cylinder portion), 74 pressure member, 74a sealing member for preventing aeration, 75 supply pipe, 101 liquid resin charge portion, 102 pressure member, 102a sealing member for preventing aeration, 103 pneumatic tank (liquid resin charge portion body), 104 pressure mechanism, 105 pressure path, 106 tank body, 107 lid portion, 108 supply pipe mount/dismount portion, 109 small cartridge, 110 air, 111 liquid resin container, 112 supply pipe.

BEST MODES FOR CARRYING OUT THE INVENTION

Compression molding methods and compression molding apparatuses employed therefor according to embodiments of the present invention are now described.

First Embodiment

A compression molding method for optical elements and a compression molding apparatus employed therefor according to a first embodiment are described with reference to FIGS. 1 to 7.

Referring to FIGS. 1 to 7, reference sign A denotes base resin in light-transmitting two-part liquid resin, and reference sign B denotes a curing agent therefor.

(Structures of Substrate Etc.)

Figure 2:
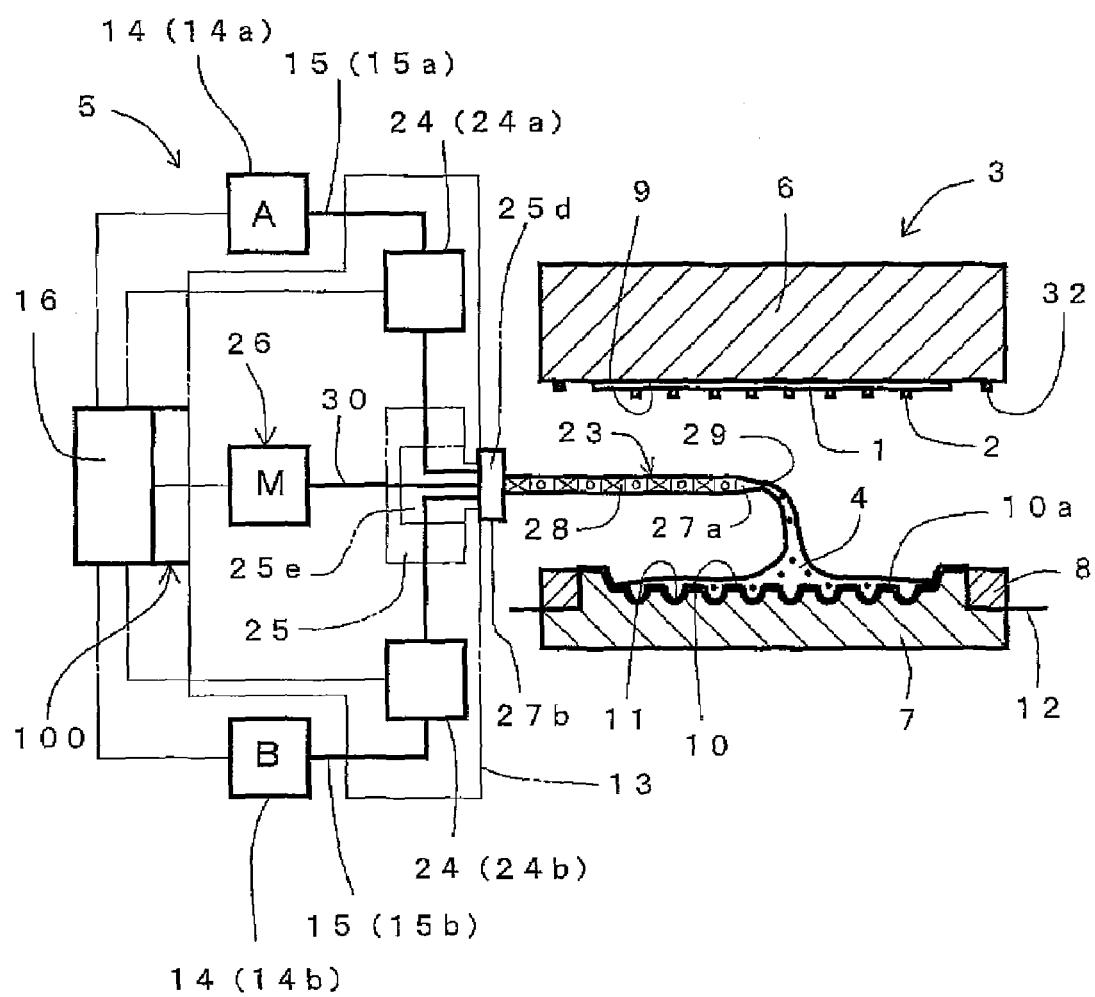
FIG. 2 is a sectional view schematically showing the compression molding apparatus according to the embodiment, illustrating a state where the resin supply mechanism supplies liquid resin into a cavity after the same is inserted between the molding surfaces of the mold assembly.

Optical elements 2 such as LED chips employed as examples of electronic components are mounted on a substrate 1 such as a lead frame employed in this embodiment. Referring to FIGS. 1 and 2, a plurality of, e.g., eight LED chips 2 are mounted on substrate 1.

In the first embodiment, eight LED chips 2 are collectively resin-sealed by compression molding. Thus, moldings are formed. The moldings are divided along cutting plane lines thereof. Consequently, eight chip-type LEDs are formed. These chip-type LEDs form parts of products relevant to light-emitting diodes.

(Structure of Overall Compression Molding Apparatus for Optical Element)

The compression molding apparatus for optical elements according to this embodiment comprises a mold assembly 3, a resin supply mechanism 5, a substrate supply mechanism (not shown) and a molding removal mechanism (not shown). Mold assembly 3 is employed for compression-molding optical elements. Resin supply mechanism 5 is employed for supplying liquid resin 4 to mold assembly 3. The substrate supply mechanism is employed for supplying substrate 1 mounted with optical elements 2 such as LED chips to mold assembly 3. The molding removal mechanism is employed for removing moldings molded by mold assembly 3 from mold assembly 3.

In a resin-sealed molding method employing the compression molding apparatus according to this embodiment, substrate 1 mounted with LED chips 2 is first supplied to mold assembly 3 by the substrate supply mechanism. Further, liquid resin 4 is supplied to mold assembly 3. Then, mold assembly 3 is closed. Thus, LED chips 2 are compression-molded with liquid resin 4 in mold assembly 3. Consequently, LED moldings are formed. Thereafter the moldings are removed from mold assembly 3 by the molding removal mechanism.

The compression molding apparatus according to this embodiment is not a transfer molding apparatus employing a resin material supply pot and a resin pressurizing plunger.

(Structures of Mold Assembly for Compression-Molding Optical Element and Mold Releasing Film)

Mold assembly 3 according to this embodiment includes an upper mold section 6, a lower mold section 7 opposed to upper mold section 6 and an intermediate mold section 8 provided between upper mold section 6 and lower mold section 7. Intermediate mold section 8, employed for holding a mold releasing film 12 in association with lower mold section 7, is in the form of a frame having a through-hole receiving lower mold section 7. Upper mold section 6 includes a substrate supply portion 9. Substrate 1 is set on substrate supply portion 9 while directing LED chips 2 downward.

Lower mold section 7 includes a general cavity 10. General cavity 10 includes individual cavities 11 corresponding to the positions and the number of the plurality of LED chips 2 mounted on substrate 1 set on substrate supply portion 9. General cavity 10 has a cavity opening in the same plane as the molding surface of lower mold section 7. Liquid resin 4 is supplied to general cavity 10 through the cavity opening.

Substrate supply portion 9 of upper mold section 6 has a mechanism (not shown) such as a fixing tool for holding the substrate, and this mechanism fixes substrate 1 while directing LED chips 2 downward.

Mold assembly 3 according to the first embodiment has a mechanism (not shown) supplying tensioned mold releasing film 12 between intermediate mold section 8 and lower mold section 7. Mold releasing film 12 covers the molding surface of lower mold section 7, to correspond to the shape of general cavity 10 including individual cavities 11. Intermediate mold section 8 and lower mold section 7 are so closed that mold releasing film 12 is held by intermediate mold section 8 and lower mold section 7.

The plurality of LED chips 2 are inserted into general cavity 10 of lower mold section 7 covered with mold releasing film 12. As described above, the plurality of LED chips 2 are so arranged as to correspond to the positions of the plurality of individual cavities 11 respectively.

Mold assembly 3 according to the first embodiment has a heater, though not shown. The heater, temporarily melting liquid resin 4 in general cavity 10, finally thermally cures liquid resin 4.

Mold assembly 3 is so closed that LED chips 2 mounted on substrate 1 are dipped in liquid resin 4 supplied to general cavity 10. Consequently, LED chips 2 are compression-molded with liquid resin 4.

Mold assembly 3 according to this embodiment has a member constituting the bottom surface of general cavity 10 movable with respect to a member constituting the side surface of general cavity 10, though not shown. The member constituting the bottom surface of general cavity 10 is movable in the vertical direction. Therefore, the member constituting the bottom surface of general cavity 10 can press liquid resin 4 stored in general cavity 10 while mold releasing film 12 is interposed therebetween. In other words, mold assembly 3 according to this embodiment can apply pressure to liquid resin 4 melted in general cavity 10 by heating, The resin-sealed molding apparatus according to this embodiment comprises a covering mechanism for covering general cavity 10 with mold releasing film 12 in response to the shape of the inner surface of mold assembly cavity 10 including the aforementioned individual cavities 11. The covering mechanism has a suction hole so provided as to communicate with mold assembly cavity 10 and an evacuation mechanism (pump) or the like forcibly discharging the air through the suction hole, for example. The evacuation mechanism forcibly discharges the air from mold assembly cavity 10 through the suction hole, Thus, mold releasing film 12 comes into close contact with general cavity 10 along the surface of general cavity 10.

(Structure of Two-Part Liquid Resin)

In this embodiment, light-transmitting silicone resin or the like, for example, is employed as liquid resin 4. In liquid resin 4, liquid base resin A and liquid curing agent B are mixed with each other at a prescribed ratio, e.g., a capacity ratio of 10:1. Finally, liquid resin 4 is thermally cured in general cavity 10.

In preparation of this liquid resin 4, the respective ones of base resin A of silicone resin and curing agent B are measured in resin supply mechanism 5. Base resin A and curing agent B are mixed with each other. Then, liquid resin 4 is supplied into general cavity 10. Liquid resin 4 is mixed silicone resin.

(Structure of Resin Supply Mechanism)

Resin supply mechanism 5 according to this embodiment includes a resin supply portion 13 constituting the body thereof, a cartridge charge portion 14 forming a liquid resin charge portion, a moving mechanism 100 moving resin supply portion 13, a transfer path 15 (flexible hose) through which liquid resin 4 flows and a control portion 16 controlling moving mechanism 100 and the like.

Cartridge charge portion 14 supplies liquid resin 4 to resin supply portion 13. At this time, base resin A and curing agent B are individually supplied to resin supply portion 13. Moving mechanism 100 can move resin supply portion 13 in respective ones of a direction X (direction perpendicular to the plane of the drawing), a direction Y and a direction Z shown in FIG. 1, i.e., the respective ones of the horizontal direction, the vertical direction and the anteroposterior direction with reference to the direction from resin supply portion 13 toward mold assembly 3. The respective ones of base resin A and curing agent B are transferred to the space between cartridge charge portion 14 and resin supply portion 13 in transfer path 15. Control portion 16 controls the respective ones of cartridge charge portion 14 and moving mechanism 100 of resin supply portion 13.

Control portion 16 can adjust the position of resin supply portion 13 in the direction Y and thereafter adjust the position in the direction Z by controlling moving mechanism 100. In other words, control portion 16 entirely or partially advances resin supply portion 13 into the space between the molding surfaces of mold assembly 3, i.e., between upper mold section 6 and lower mold section 7 (intermediate mold section 8) and retreats the former from the latter by controlling moving mechanism 100 of resin supply portion 13.

Further, liquid resin 4 is supplied from cartridge charge portion 14 to resin supply portion 13 through transfer path 15. Thereafter liquid resin 4 is supplied to general cavity 10 covered with mold releasing film 12.

(Structure of Cartridge Charge Portion, i.e., Liquid Resin Charge Portion)

Cartridge charge portion 14 includes an A cartridge charge portion 14a corresponding to base resin A and a B cartridge charge portion 14b corresponding to curing agent B, as shown in FIGS. 1 and 2. A cartridge charge portion 14a and B cartridge charge portion 14b are basically identical in structure to each other.

A cartridge charge portion 14a includes an A cartridge 17a charged with base resin A, an A cartridge charge portion body 18a charged with A cartridge 17a and an A pressure mechanism 19a such as an air cylinder discharging base resin A from A cartridge 17a by pressing. The forward end of A cartridge 17a is mountable on a supply pipe mount/dismount portion 108 of A cartridge charge portion 14a.

A cartridge 17a includes a hollow cylindrical A cartridge body 20a, an A plunger 21a applying pressure to the resin by pressing base resin A in A cartridge body 20a and an A sealing member 22a such as an O-ring provided along the outer peripheral surface of A plunger 21a in order to prevent the resin from aeration.

The space in A cartridge body 20a and an A transfer path 15a for the liquid resin communicate with each other through the space in A cartridge charge portion body 18a, i.e., an A cartridge supply pipe.

Therefore, base resin A of liquid resin 4 in A cartridge body 20a can be transferred from A cartridge 17a to resin supply portion 13 through the supply pipe of A cartridge charge portion body 18a and A transfer path 15a by pressing A plunger 21a with A pressure mechanism 19a in A cartridge charge portion 14a.

In B cartridge charge portion 14b, curing agent B in a BR cartridge body 20b can be transferred from a B cartridge 17b to a supply pipe of a B cartridge charge portion body 18b and a B transfer path 151, by pressing all plunger 21b with a B pressure mechanism 19b, similarly to A cartridge charge portion 14a.

Base resin A and curing agent B can be transferred to resin supply portion 13 from cartridge charge portions 14a and 14b through transfer path 15 respectively. Base resin A and curing agent B are adjusted in a prescribed ratio when transferred from cartridge charge portions 14a and 14b to resin supply portion 13.

Cartridge 17 can be mounted on cartridge charge portion body 18 and dismounted from cartridge charge portion body 18. Therefore, cartridge 17 can be properly exchanged. Thus, no necessity of interrupting compression molding results from shortages of base resin A and curing agent B to be supplied from cartridge charge portion 14 to resin supply portion 13. Consequently, productivity for moldings can be improved.

Cartridge charge portion 14 has a plunger 21, and a sealing member 22 for preventing the resin from aeration is provided on the circumferential surface of plunger 21. Therefore, the clearance between the inner diameter of cartridge body 20 swollen/enlarged by liquid resin 4 and the outer diameter of plunger 21 is sealed with sealing member 22.

In other words, sealing member 22 blocks the clearance between cartridge body 20 and plunger 21, whereby air bubbles can be prevented from mixing into liquid resin 4 supplied to general cavity 10. Therefore, air bubbles can be prevented from remaining in transparent resin portions of LED moldings. Consequently, the yield of the LED moldings can be improved, and optical quality (characteristic) of the LED moldings can be improved.

(Structure of Body of Resin Supply Mechanism, i.e., Resin Supply Portion)

The body of resin supply mechanism 5, i.e., resin supply portion 13 includes a horizontal nozzle 23, liquid resin 4, a measuring portion 24, a connecting pipe 25 and a rotational driving portion 26. Liquid resin 4 contains base resin A and curing agent B, Rotational driving portion 26 includes a rod 30.

Horizontal nozzle 23 discharges liquid resin 4 prepared by mixing base resin A and curing agent B with each other into general cavity 10. Measuring portion 24 measures the respective ones of base resin A and curing agent B transferred from cartridge charge portion 14 through transfer path 15. Liquid resin 4 is transferred from measuring portion 24 to horizontal nozzle 23 through connecting pipe 25. Rotational driving portion 26 is employed for transferring liquid resin 4 from connecting pipe 25 to horizontal nozzle 23.

In use of resin supply portion 13, base resin A and curing agent B are first transferred from cartridge charge portion 14 to measuring portion 24 through transfer path 15 respectively, and measured in measuring portion 24. Thereafter base resin A and curing agent B are transferred to horizontal nozzle 23 through connecting pipe 25. Further, base resin A and curing agent B are mixed with each other in horizontal nozzle 23 due to the action of rotational driving portion 26. Consequently, liquid resin 4 is formed. Liquid resin 4 is finally supplied to general cavity 10.

Resin supply portion 13, i.e., the integral structure of horizontal nozzle 23, connecting pipe 25 and measuring portion 24 is inserted between the molding surfaces of mold assembly 3 and removed therefrom by moving mechanism 100.

(Structure of Measuring Portion)

Measuring portion 24 has an A measuring portion 24a, i.e., an A measuring cylinder measuring base resin A and a B measuring portion 24b, i.e., a B measuring cylinder measuring curing agent B. A measuring portion 24a and B measuring portion 24b have measuring cylinder bodies, pressure pistons and mechanisms driving the pressure pistons respectively, though not shown.

When the mechanisms driving the pistons drive the pistons in the respective ones of A measuring portion 24a and B measuring portion 24b, therefore, liquid resin 4 in the measuring cylinder bodies is pressed by the pistons. Thus, liquid resin 4 can be measured.

When the compression molding apparatus is used, base resin A is first supplied from A cartridge charge portion 14a to A measuring portion 15a through A transfer path 15a. Then, base resin A is sucked into the A measuring cylinder body, and charged into the A measuring cylinder body. Thereafter base resin A in the A measuring cylinder body is continuously pressed by the A pressure piston in a prescribed time. Thus, a prescribed volume of base resin A is continuously transferred to connecting pipe 25. This is referred to as a servo cylinder system.

Curing agent B is supplied to B measuring portion 24b from B cartridge charge portion 14b through B transfer path 15b. Curing agent B in the B measuring cylinder body is intermittently pressed by the B pressure piston for a prescribed time in correspondence to the prescribed time in which the prescribed volume of base resin A is transferred in A measuring portion 24a. At this time, pulse waves are supplied to curing agent B. Thus, curing agent B is intermittently transferred to connecting pipe 25. This is referred to as a DigiMeta cylinder system.

According to this embodiment, curing agent B of 10 volume units is intermittently transferred to connecting pipe 25 by 1 volume unit while base resin A of 100 volume units is continuously transferred to connecting pipe 25 by a constant volume. Therefore, the volume mixing ratio between base resin A and curing agent B in liquid resin 4 can be set to 10:1.

(Structure of Connecting Pipe)

Connecting pipe 25 is provided with a T-tube, and the T-tube has two inlets 25a and 25b and an outlet 25c. More specifically, connecting pipe 25 includes an A inlet (A pipe) 25a receiving base resin A from A measuring portion 24a, a B inlet (B pipe) 25b receiving curing agent B from B measuring portion 24b and an AB outlet (AB pipe) 25c guiding base resin A and curing agent B to nozzle 23. AB outlet 25c has a nozzle mount portion 25d on which horizontal nozzle 23 is mountable. AB pipe 25c joins the flow of A pipe 25a and the flow of B pipe 25b with each other.

Therefore, base resin A is supplied from A measuring portion 24a to A inlet 25a (A pipe), curing agent B is supplied from B measuring portion 24b to B inlet 25b (13 pipe 25b), and a mixed solution of base resin A and curing agent B is transferred from AB pipe 25c (AB outlet 25c) to horizontal nozzle 23.

(Structure of Horizontal Nozzle and Structure of Rotational Driving Portion)

Figure 3:
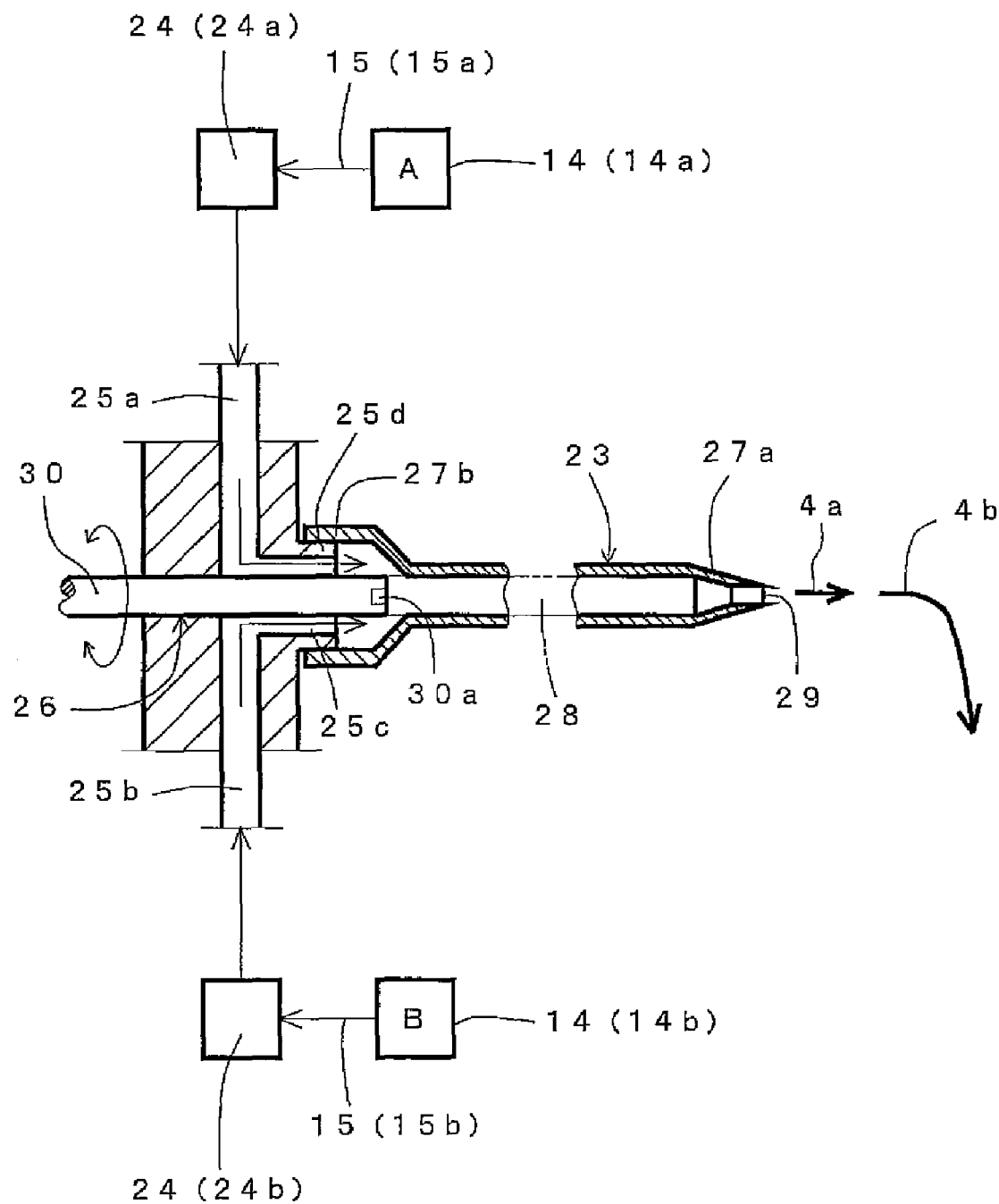
FIG. 3 is a sectional view of a horizontal nozzle in the resin supply mechanism of the compression molding apparatus according to the embodiment.

Horizontal nozzle 23 includes a hollow cylindrical nozzle body 27 and a spiral supply member 28, for example, as shown in FIG. 3. Spiral supply member 28 is rotatably provided in nozzle body 27, and has a spiral structure for mixing base resin A and curing agent B with each other.

In horizontal nozzle 23, therefore, spiral supply member 28 first rotates in nozzle body 27. Thus, base resin A and curing agent B are mixed with each other. The mixed solution of base resin A and curing agent B is transferred from connecting pipe 25 to a nozzle forward end 27a through nozzle body 27. Thereafter liquid resin 4 is discharged from a discharge port 29 provided on forward end 27a.

A base end 27b of horizontal nozzle 23 is mountable on nozzle mount portion 25d of connecting pipe 25, and dismountable from nozzle mount portion 25d. Therefore, an old horizontal nozzle 23 can be easily exchanged for a new horizontal nozzle 23. Consequently, horizontal nozzle 23 can be utilized as a disposable component. Further, the respective ones of the space in horizontal nozzle 23 and the space in nozzle mount portion 25d of connecting pipe 25 can be easily cleaned.

As shown in FIGS. 2 and 3, rotational driving portion 26 has a motor M reciprocally rotating spiral supply member 28 and a rod 30 connecting motor M and spiral supply member 28 with each other. Rod 30 is inserted into the space in nozzle mount portion 25d through the space in AB pipe 25c. Further, rod 30 and spiral supply member 28 are stopped to each other by a stop portion 30a.

(Method of Discharging Liquid Resin with Resin Supply Mechanism)

According to the aforementioned structure, motor M is so positively rotated as to rotate rod 30. Thus, spiral supply member 28 is rotated. Consequently, base resin A and curing agent B are mixed with each other in nozzle body 27 and transferred from nozzle base end 27b to nozzle forward end 27a.

Therefore, liquid resin 4 can be discharged from discharge port 29 of nozzle forward end 27a in the horizontal direction with prescribed pressure by positively rotating spiral supply member 28. Thus, liquid resin 4 can be supplied into general cavity 10.

Liquid resin 4a discharged from discharge port 29 of nozzle forward end 27a falls onto general cavity 10 while drawing a fall parabola 4b corresponding to the pressure in the horizontal direction and the gravity in the vertical direction. At this time, the falling position of liquid resin 4 on the bottom surface of general cavity 10 is in the vicinity of a position immediately under discharge port 29.

When motor M (rod 30) is so reversely rotated as to reversely rotate spiral supply member 28, mixed liquid resin 4 can be transferred from nozzle forward end 27a to nozzle base end 27b. In other words, liquid resin 4 can be drawn into nozzle body 27 from discharge port 29 of nozzle forward end 27a. Thus, liquid resin 4 can be prevented from dripping from discharge port 29.

(Moving Mechanism for Resin Supply Portion)

As described above, resin supply portion 13 is moved by moving mechanism 100 along the respective ones of the direction X, the direction Y and the direction Z. Thus, the entire resin supply portion 13 or horizontal nozzle 23 forming part thereof is inserted between upper mold section 6, lower mold section 7 and intermediate mold section 8 and removed therefrom along the direction Z while the position in the direction Y is fixed.

As described above, further, horizontal nozzle 23 is inserted into mold assembly 3 in a horizontally extending state, Thus, a distance 31 can be reduced as compared with a case of inserting a conventional vertical dispenser between the molding surfaces of the mold assembly. Therefore, the compression molding apparatus can be downsized.

(Evacuation Mechanism for Space in Mold Assembly)

An outside air cutoff member 32 such as an O-ring is provided on the molding surface of upper mold section 6 according to this embodiment, to enclose substrate supply portion 9. Outside air cutoff member 32 is provided on a position opposed to the molding surface of intermediate mold section 8 closer to upper mold section 6, as shown in FIGS. 1 and 2. The molding surface of upper mold section 6 has a suction port though not shown, while this suction port is connected to an evacuation mechanism such as a vacuum pump forcibly discharging the air by suction.

In use of the compression molding apparatus, outside air cutoff member 32 of upper mold section 6 is so brought into contact with the molding surface of intermediate mold section 8 closer to upper mold section 6 that the space in mold assembly 3 is cut off from the outside air while the molding surface of upper mold section 6 and the molding surface of intermediate mold section 8 closer to upper mold section 6 separate from each other by a prescribed distance. Further, the evacuation mechanism so forcibly sucks the air from the space cut off from the outside air that the space cut off from the outside air is set to a prescribed vacuum state. Thus, air bubbles are prevented from mixing into liquid resin 4. Therefore, transparent resin portions of moldings molded in mold assembly cavity 10 are prevented from formation of voids (air bubbles).

The molding surface of upper mold section 6 and the molding surface of lower mold section 7 (intermediate mold section 8) are closed before liquid resin 4 is supplied to the space cut off from the outside air.

(Compression Molding Method for Optical Element)

A method of compression-molding LED chips 2 mounted on substrate 1 with the aforementioned compression molding apparatus (mold assembly 3) for optical elements is now described.

First, substrate 1 mounted with a prescribed number of LED chips 2 is supplied to substrate supply portion 9 of opened mold assembly 3 by the substrate supply mechanism. At this time, the surface of substrate 1 mounted with the LED chips is directed downward. Further, mold releasing film 12 is held by intermediate mold section 8 and lower mold section 7 while covering the inner surface of general cavity 10 and the molding surface of lower mold section 7.

Then, resin supply portion 13 is moved by moving mechanism 100. Thus, horizontal nozzle 23 provided on resin supply portion 13 is inserted between the molding surfaces of upper mold section 6 and lower mold section 7 (intermediate mold section 8) in the horizontally extending state. Thereafter horizontal nozzle 23 horizontally discharges liquid resin 4 from discharge port 29 of forward end 27a thereof with the prescribed pressure. Thus, liquid resin 4 is supplied into general cavity 10 covered with mold releasing film 12. Thereafter liquid resin 4 is heated and melted in general cavity 10.

Then, mold assembly 3 is closed. Thus, LED chips 2 mounted on substrate 1 are dipped in liquid resin 4 stored in lower mold section cavity 10. In other words) compression molding is executed. After a lapse of a time necessary for curing liquid resin 4, upper mold section 6 and lower mold section 7 (intermediate mold section 8) are opened. Then, LED moldings are removed by the molding removal mechanism.

The cavity bottom surface member may move upward, so that liquid resin 4 stored in general cavity 10 is pressed by the member constituting the bottom surface of general cavity 10 through mold releasing film 12. Thus, adhesion between substrate 1 and liquid resin 4 can be improved.

(Method of Supplying Liquid Resin to Mold Assembly Cavity, or Locus of Liquid Resin on Cavity Surface)

A method of supplying the liquid resin to the lower mold section cavity surface or a method of sprinkling the liquid resin and the locus thereof are described with reference to FIGS. 6 and 7.

According to this embodiment, liquid resin 4 is supplied into general cavity 10 by moving discharge port 29 of horizontal nozzle 23 along the respective ones of the direction X and the direction Z while the position in the direction Y is maintained.

The method of supplying liquid resin 4 into lower mold section cavity 10 is described with reference to FIG. 6.

First, horizontal nozzle 23 is inserted between the molding surfaces of mold assembly 3 in the horizontally extending state and in a state maintained on a prescribed vertical position. At this time, forward end 27a of horizontal nozzle 23 is gradually inserted between the molding surfaces of mold assembly 3.

Horizontal nozzle 3 drops liquid resin 4 onto the inner surface of general cavity 10, i.e., a cavity surface 10a. When the supply of liquid resin 4 is started, discharge port 29 of nozzle forward end 27a is so arranged that liquid resin 4 falls onto a middle position I of cavity surface 10a.

Then, while liquid resin 4 falls from discharge port 29 of horizontal nozzle forward end 27a, the position of discharge port 29 of nozzle forward end 27a moves so that the fall position of liquid resin 4 on cavity surface 10a reciprocates between the middle position on cavity surface 10a and the respective ones of positions II, III, IV and V in the vicinity of the peripheral edge of the opening in cavity surface 10a. Thus, liquid resin 4 is homogeneously supplied into cavity 10.

Figure 6:
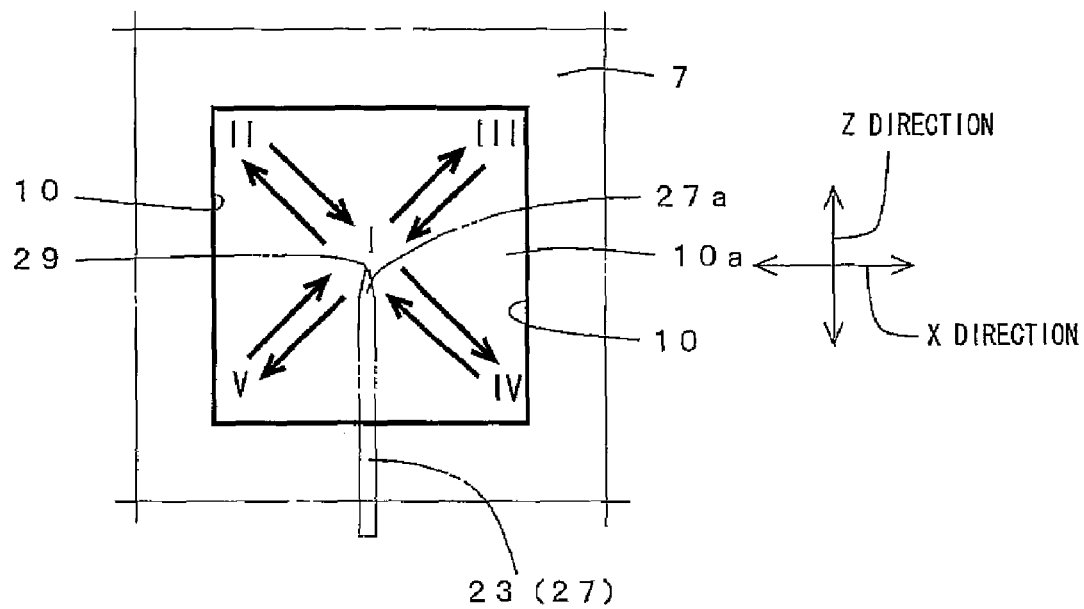
FIG. 6 is an enlarged plan view of still another principal part of the compression molding apparatus according to the embodiment for illustrating a method of supplying the liquid resin to a cavity surface, i.e., a sprinkling method.

According to this embodiment, middle position I on cavity surface 10a and four corner positions II, III, IV and V as the positions in the vicinity of the peripheral edge of the opening in cavity surface 10a are defined in relation to the supply position of liquid resin 4 on lower mold section cavity surface 10a, as shown in FIG. 6.

Thus, liquid resin 4 is supplied to cavity 10 so that the fall position thereof separately reciprocates between middle position I and corner position II, between middle position I and corner position III, between middle position I and corner position IV and between middle position I and corner position V in this order. In this case, liquid resin 4 is supplied to general cavity 10 so that the locus of liquid resin 4 on cavity surface 10a draws an alphabetical X. Thus, liquid resin 4 is homogeneously distributed on lower mold section cavity surface 10a. In other words, the surface of liquid resin 4 forms not a convex plane but a horizontal plane. Therefore, the moldings compressed in lower mold section cavity 10 are prevented from residual of unloaded portions. Consequently, the moldings Call be prevented from dispersion in quality.

Further, liquid resin 4 is supplied to positions in the vicinity of the four corners of cavity surface 10a in an early stage when supplied to cavity surface 10a in the X-shaped manner. Therefore, liquid resin 4 can be prevented from partial curing on the positions in the vicinity of the four corners of cavity surface 10a. Thus, occurrence of such inconvenience that lumps of cured resin mix into the moldings is prevented. Further, occurrence of such inconvenience that lumps of cured resin deform or cut wires of the LEDs is prevented. Thus, the yield of the moldings can be improved.

Another example of the method of supplying the liquid resin into the lower mold section cavity is now described with reference to FIG. 7.

In this supply method of the other example, horizontal nozzle 23 is first inserted between the molding surfaces of mold assembly 3 in the state horizontally extending on the prescribed vertical position. At this time, horizontal nozzle 23 is gradually inserted from forward end 27a toward base end 27b. Thus, discharge port 29 of nozzle forward end 27a is arranged above cavity 10a so that the first fall position of liquid resin 4 on cavity surface 10a corresponds to a position I in the vicinity of a corner portion on cavity surface 10a.

Then, horizontal nozzle 23 is moved so that the fall position of liquid resin 4 on cavity surface 10a moves in the direction X and thereafter moves in the direction Z. Also according to this, liquid resin 4 is homogeneously distributed into cavity 10.

Figure 7:
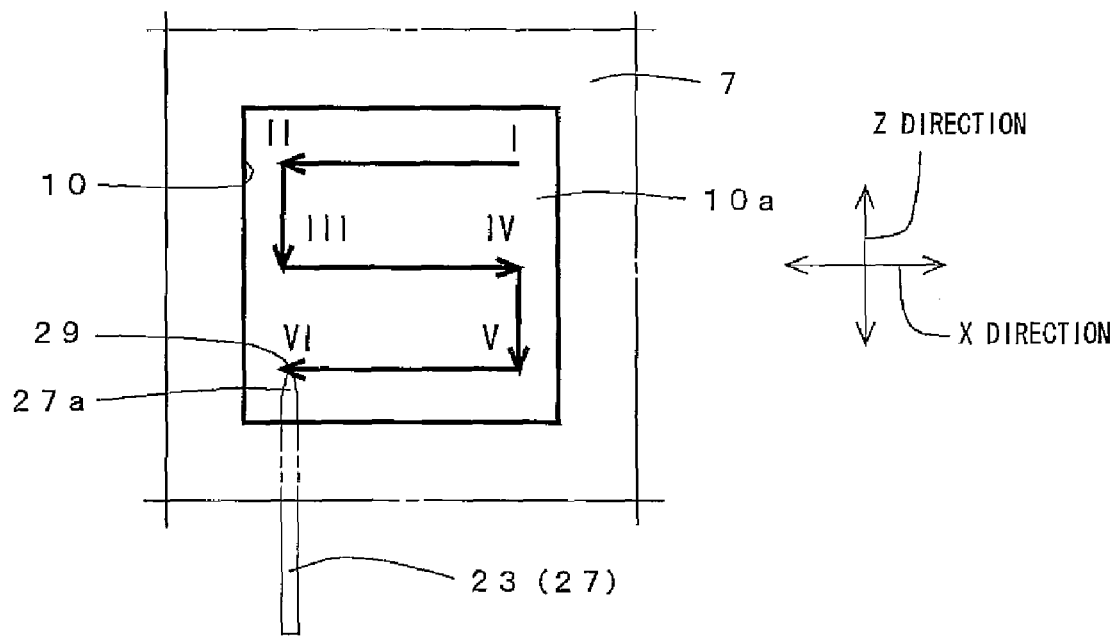
FIG. 7 is an enlarged plan view of the principal part of the compression molding apparatus according to the embodiment for illustrating another method of supplying the liquid resin to the cavity surface, i.e.) another sprinkling method.

More specifically, discharge port 29 of horizontal nozzle 23 moves so that the fall position of liquid resin 4 on cavity surface 10a moves in order of necessary positions I, II, III, IV, V and VI, as shown in FIG. 7. Consequently, the locus of the fall position of liquid resin 4 draws a sigmoid curve on cavity surface 10a. Also according to the supply method shown in FIG. 7, an effect similar to the effect attained by the supply method shown in FIG. 6 can be attained.

Second Embodiment

A resin-sealed molding method and a resin-sealed molding apparatus employed therefor according to a second embodiment are now described with reference to FIG. 8.

Figure 8:
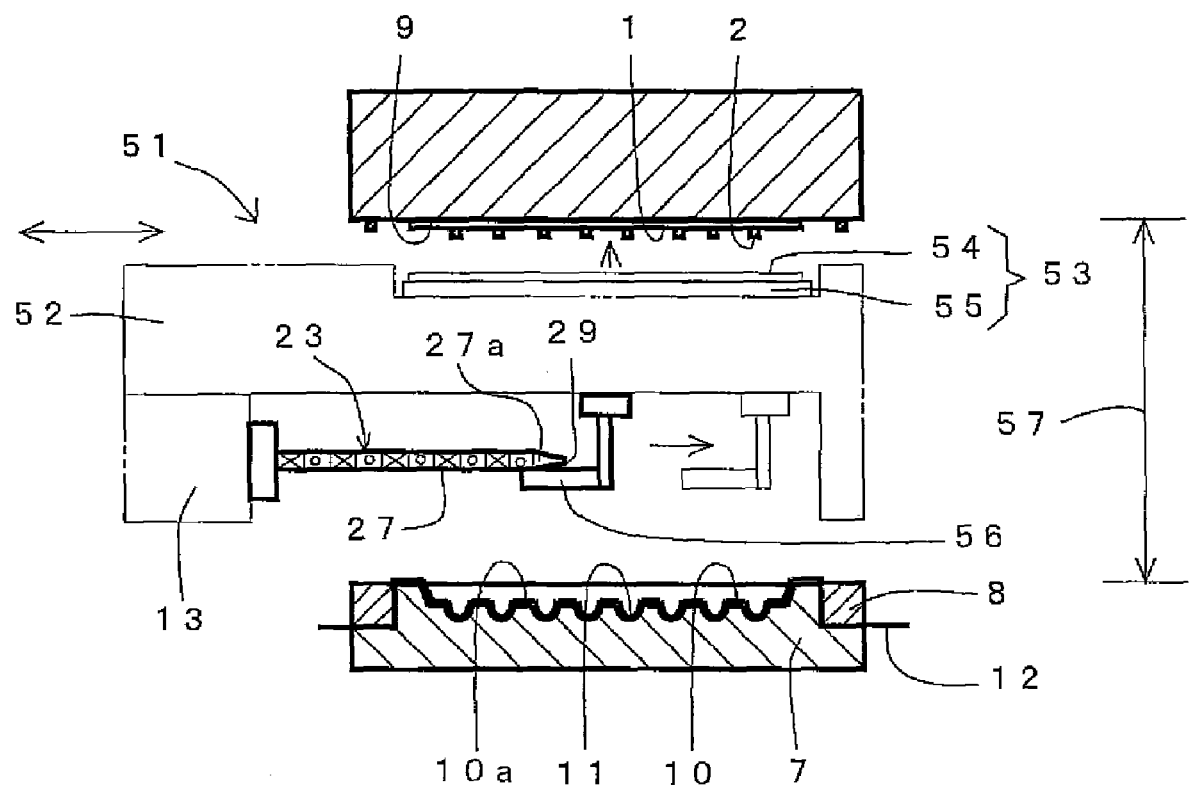
FIG. 8 is a sectional view schematically showing the compression molding apparatus according to the embodiment, illustrating a state where a molding material supply mechanism simultaneously inserts both of the liquid resin and a substrate between the molding surfaces of the mold assembly.

As shown in FIG. 8, a mold assembly 3 of a compression molding apparatus for optical elements according to this embodiment is identical to that according to the first embodiment, and hence redundant description is not repeated unless particularly required.

(Structure of Simultaneous Transport Mechanism)

As shown in FIG. 8, the compression molding apparatus comprises a simultaneous transport mechanism 51 simultaneously supplying a substrate 1 and liquid resin 4 between molding surfaces of mold assembly 3. Simultaneous transport mechanism 51 includes a body 52 thereof and a substrate supply mechanism 53 provided on the upper portion thereof for supplying substrate 1. A resin supply portion 13 of a resin supply mechanism 5 is fixed to the lower portion of body 52, or so provided as to be movable along the respective ones of a direction X and a direction Z with respect to body 52.

As understood from the above description, substrate supply mechanism 53 and resin supply portion 13 are integrally provided on body 52. Therefore, simultaneous transport mechanism 51 can supply liquid resin 4 into a general cavity 10 of a lower mold section 7 simultaneously with supplying substrate 1 to a substrate supply portion 9 of an upper mold section 6. Substrate supply mechanism 53 includes a substrate receiving portion 54 and a substrate lifting portion (lift) 55.

When simultaneous transport mechanism 51 is employed, substrate 1 is lifted by substrate lifting portion 55 to be set on substrate supply portion 9 in a state placed on substrate receiving portion 45 while directing LED chips 2 downward.

The structure of liquid resin supply portion 13 shown in the second embodiment is identical to the structure of resin supply portion 13 shown in the first embodiment, and hence redundant description is not repeated.

According to the resin-sealed molding apparatus of this embodiment, therefore, liquid resin 4 is horizontally discharged from a discharge port 29 of a horizontal nozzle 23 with prescribed pressure and supplied to general cavity 10, similarly to the resin-sealed molding apparatus according to the first embodiment.

(Structure of Pan for Liquid Resin)

A pan portion 56 receiving liquid resin 4 dripping from discharge port 29 of a nozzle forward end 27a is provided under body 52 of simultaneous transport mechanism 52. Pan portion 56 moves to a portion under discharge port 29 of nozzle forward end 27a when horizontal nozzle 23 does not supply liquid resin 4 to mold assembly 3. When liquid resin 4 falls from discharge port 29 of nozzle 23 onto cavity 10, on the other hand, pan portion 56 separates from the position under discharge port 29 of nozzle 23. After horizontal nozzle 23 separates from mold assembly 3, pan portion 56 moves to the position under discharge port 29 of nozzle forward end 27a again, to receive liquid resin 4 dripping from discharge port 29.

Thus, liquid resin 4 dripping from discharge port 29 is prevented from adhering to molding surfaces other than the inner surface of mold assembly cavity 10 as resin flashes. Therefore, occurrence of such inconvenience that a clearance is formed between the molding surfaces when mold assembly 3 is closed due to resin flashes adhering between the molding surfaces is prevented.

(Compression Molding Method for Optical Element)

A method of compression-molding the LED chips mounted on the substrate with the compression molding apparatus for optical elements and the simultaneous transport mechanism is now described. The compression molding method for optical elements according to this embodiment is basically similar to that according to the first embodiment.

First, substrate 1 and liquid resin 4 are simultaneously supplied to mold assembly 3 when simultaneous transport mechanism 51 is inserted between the molding surfaces of mold assembly 3. At this time, substrate 1 is mounted on substrate supply portion 9 of upper mold section 6 while liquid resin 4 falls onto general cavity 10 covered with a mold releasing film 12, similarly to the first embodiment. At this tine, pan portion 56 is located to separate from the position under discharge port 29 of horizontal nozzle 23.

Then, mold assembly 3 is closed so that LED chips 2 mounted on substrate 1 are dipped in liquid resin 4 stored in general cavity 10 and resin-sealed by compression molding. After a lapse of a time necessary for curing liquid resin 4, upper mold section 6 and lower mold section 7 (intermediate mold section 8) are opened, and moldings are removed by a molding removal mechanism.

According to the aforementioned resin-sealed molding method of this embodiment, horizontal nozzle 23 is inserted between the molding surfaces of mold assembly 3 provided on the compression molding apparatus for optical elements in a horizontally extending state along with simultaneous transport mechanism 51, similarly to that according to the first embodiment. Therefore, the distance 57 between the molding surfaces of mold assembly 3 according to this embodiment is small as compared with distance 92 between the molding surfaces of mold assembly 82 of the conventional compression molding apparatus provided with vertical dispenser 81. Consequently, the compression molding apparatus for optical elements (electronic components) can be downsized.

When a mechanism evacuating general cavity 10 and such a structure that the member constituting the bottom surface of general cavity 10 is separable from the member constituting the side surface of general cavity 10 are employed in the resin-sealed molding method according to this embodiment similarly to the resin-sealed molding method according to the first embodiment, an effect similar to the effect attained by the resin-sealed molding method according to the first embodiment can be attained.

Also in the resin-sealed molding method according to this embodiment, the method of supplying liquid resin 4 to mold assembly cavity 10 shown in FIGS. 6 and 7 can be employed. Therefore, an effect similar to the effect attained by the supply method shown in FIG. 6 or 7 can be attained also in this embodiment.

While the structure provided with spiral supply member 28 in horizontal nozzle 23 is illustrated in each of the aforementioned embodiments, any mechanism may be employed as that mixing liquid resin 4. For example, a uniaxial eccentric screw pump (Mono pump) described later may be employed as the mechanism nixing liquid resin 4 and supplying the same to general cavity 10. In each embodiment, no mechanism prompting mixing of base resin A and curing agent B may be provided but only hollow cylindrical nozzle body 27 may be mounted on resin supply portion 13.

In each embodiment, base resin A flowing in A pipe 25a and curing agent B flowing in B pipe 25b join with each other in AB pipe 25c. However, a storage portion 25e capable of transferring base resin A4 passing through A pipe 25a and curing agent B passing through B pipe 25b to AB pipe 25c in a state storing the same.

While the horizontal nozzle is inserted between the molding surfaces of mold assembly 3 in each embodiment, liquid resin 4 may be horizontally discharged with such prescribed pressure that the same reaches general cavity 10 from discharge port 29 of horizontal nozzle 23 in a state where discharge port 29 of horizontal nozzle 23 is arranged outside mold assembly 3.

In this case, a method of drawing liquid resin 4 into horizontal nozzle 23 by reversely rotating motor M simultaneously with termination of discharge of liquid resin 4 or a method of moving the aforementioned pan portion 56 to the position under discharge port 29 of horizontal nozzle 23 simultaneously with termination of discharge of liquid resin 4 is preferably employed.

Third Embodiment

A compression molding method and a compression molding apparatus employed therefor according to a third embodiment are now described with reference to FIGS. 9 to 17. The compression molding apparatus according to the third embodiment employs the structure described below in the structure employed in each of the aforementioned embodiments.

The structure of the compression molding apparatus for electronic components according to this embodiment is basically identical to that in each of the aforementioned embodiments and portions denoted by the same reference signs have structures identical to each other in comparison between this embodiment and each of the aforementioned embodiments, and hence redundant description is not repeated unless particularly required.

(Other Measuring Portion in Resin Supply Mechanism)

Other measuring portions in a resin supply mechanism are first described with reference to FIGS. 9 and 10.

Figure 9:
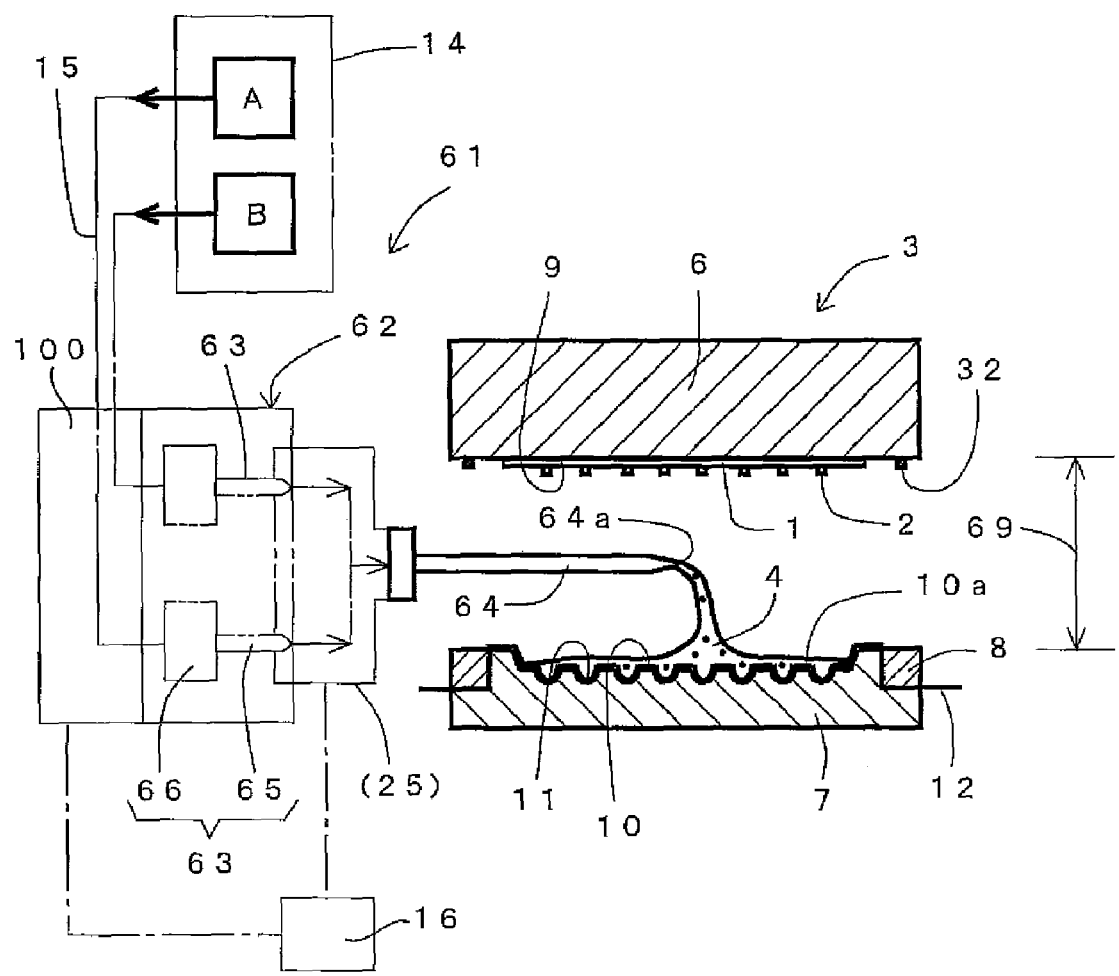
FIG. 9 is a sectional view schematically showing a compression molding apparatus according to another embodiment, illustrating a mold assembly and a resin supply mechanism.
Figure 10:
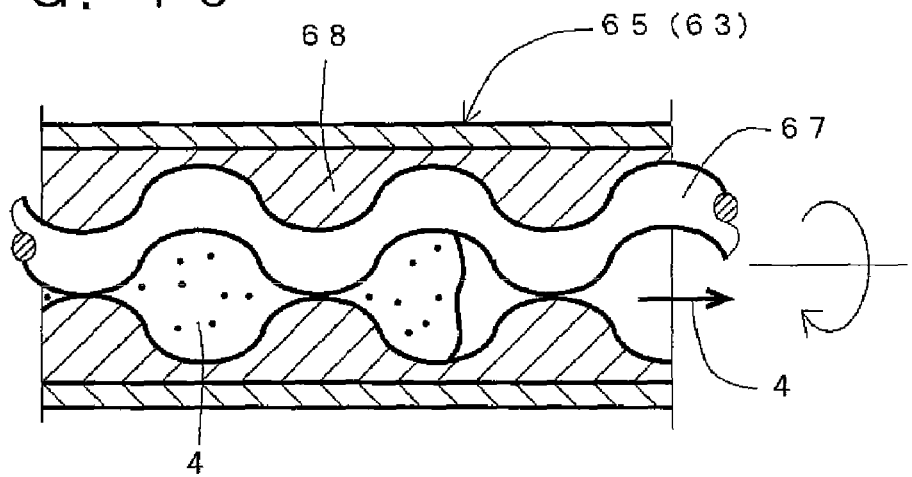
FIG. 10 is an enlarged schematic sectional view of a principal part of a measuring portion of a resin supply portion in the compression molding apparatus according to the other embodiment.

The compression molding apparatus for electronic components shown in FIGS. 9 and 10 comprises a mold assembly 3 for compression molding, a resin supply mechanism 61 and the like. Resin supply mechanism 61 includes a cartridge charge portion 14 serving as a charge portion for liquid resin 4 and a resin supply portion 62.

Resin supply portion 62 includes measuring portions 63 measuring liquid resin 4 supplied from cartridge charge portion 14, a horizontal nozzle 64 horizontally discharging liquid resin 4 into a cavity 10 of mold assembly 3 and a connecting pipe 25 having a T-tube making measuring portions 63 and horizontal nozzle 64 communicate with each other.

Figure 4:
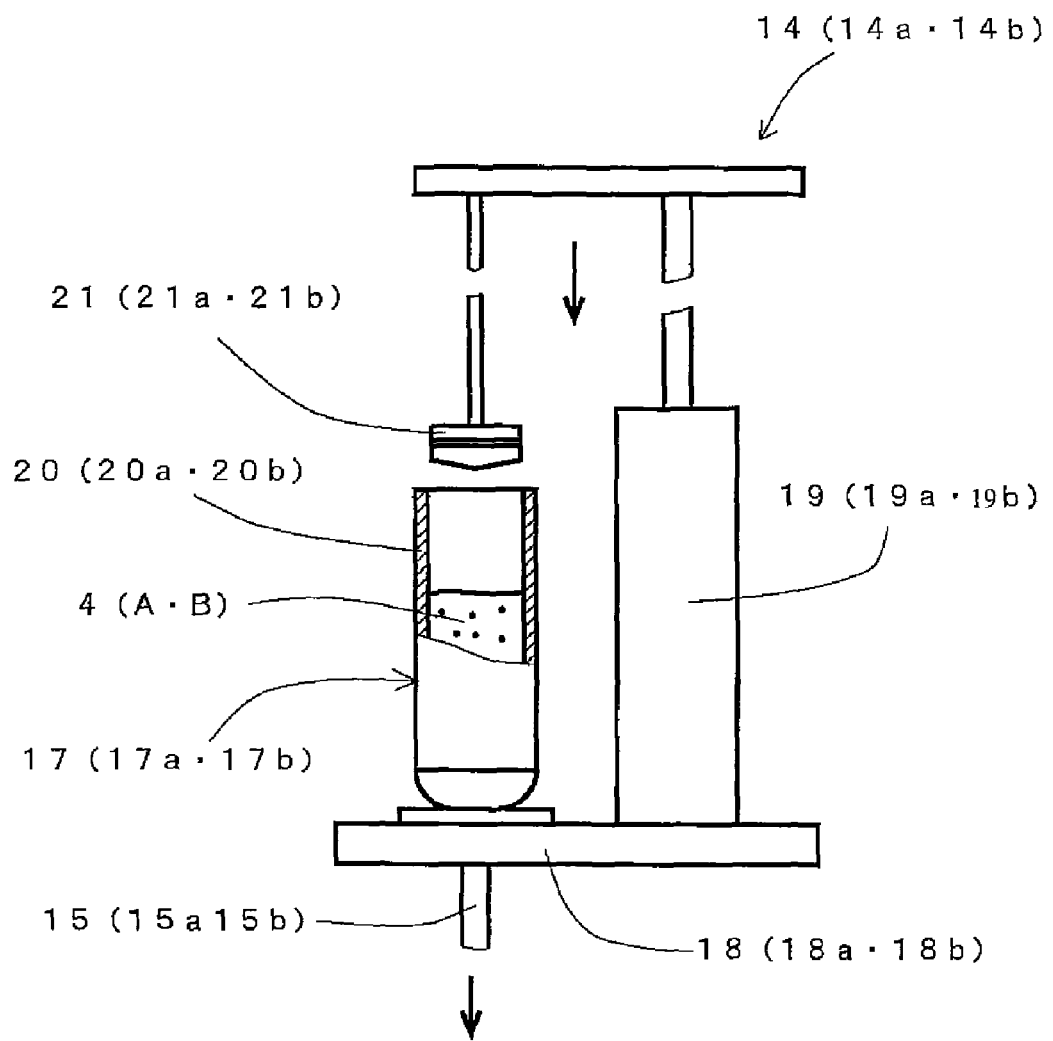
FIG. 4 is an enlarged sectional view of a principal part of the compression molding apparatus according to the embodiment, showing a cartridge charge portion.
Figure 5:
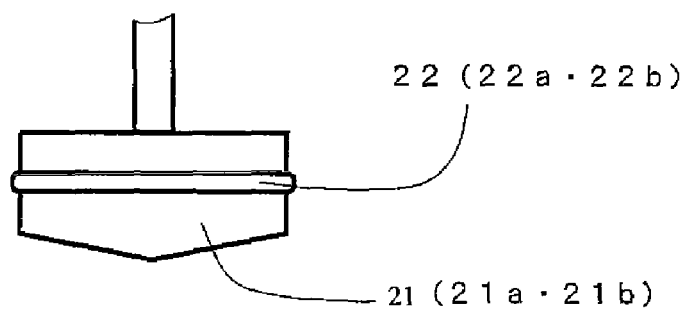
FIG. 5 is an enlarged sectional view of another principal part of the compression molding apparatus according to the embodiment, showing a plunger of the cartridge charge portion.

Cartridge charge portion 14 and connecting pipe 25 shown in FIGS. 9 and 10 have structures basically similar to those of cartridge charge portion 14 shown in FIG. 4 and connecting pipe 25 shown in FIG. 3 according to the first embodiment.

According to this embodiment, liquid resin 4 is first supplied from cartridge charge portion 14 to measuring portions 63. Then, liquid resin 4 is measured by measuring portions 63, and thereafter supplied to connecting pipe 25. Then, liquid resin 4, i.e., base resin A and a curing agent B are mixed with each other, to reach horizontal nozzle 64 through connecting pipe 25. Thereafter liquid resin 4 is horizontally discharged from a discharge port 64a of horizontal nozzle 64 with prescribed pressure, and supplied to a general cavity 10 covered with a mold releasing film 12.

Measuring portions 63 have measuring nozzle potions 65 measuring liquid resin 4 with uniaxial eccentric screw pumps (Mono pumps) and motors 66 driving measuring nozzle portions 65.

As shown in FIG. 10, each measuring nozzle portion 65 has a rotor 67 (structure corresponding to an external thread) and a stator 68 (structure corresponding to an internal thread) provided on the inner wall of a tube of measuring nozzle portion 65. Motor 66 rotates rotor 67 so that a prescribed volume of liquid resin 4 can be supplied into connecting pipe 25.

Horizontal nozzle 64 includes a mixing member (spiral mixing member, for example) having a shape suitable for mixing two-part liquid resin, for example, in the nozzle body thereof, though not shown. Therefore, base resin A and curing agent B form a turbulence in horizontal nozzle 64, and are homogeneously mixed with each other. Horizontal nozzle 64 is provided to be mountable on and dismountable from connecting pipe 25, similarly to horizontal nozzle 23 according to the first embodiment. Therefore, horizontal nozzle 64 can be utilized as a disposable component (refer to nozzle mount portion 25d shown in FIG. 3).

The two measuring portions 63 corresponding to base resin A and curing agent B respectively, connecting pipe 25 and horizontal nozzle 64 are arranged along the same horizontal plane as resin supply portion 62.

First, base resin A and curing agent B are separately supplied to measuring portions 63 (measuring nozzle portions 65) corresponding to the respective ones from cartridge charge portion 14 respectively. A prescribed volume of base resin A and another prescribed volume of curing agent B are separately measured in measuring nozzle portions 65 respectively. Then, base resin A and curing agent B are supplied from measuring nozzle portions 65 to horizontal nozzle 64 through connecting pipe 25 respectively, and mixed with each other therein (refer to A pipe 25a, B pipe 25b and AB pipe 25c shown in FIG. 3).

Then, liquid resin 4 is horizontally discharged from discharge port 64a of horizontal nozzle 64 with prescribed pressure, similarly to each embodiment. Thus, liquid resin 4 is supplied into lower mold section cavity 10.

According to the compression molding apparatus for optical elements of this embodiment, horizontal nozzle 64 is inserted between an upper mold section 6 and a lower mold section 7 (intermediate mold section 8) in a horizontally extending state and drawn out therefrom, similarly to that of each of the aforementioned embodiments. Therefore, the distance 69 between the molding surfaces of mold assembly 3 can he reduced as compared with mold assembly 82 of the conventional compression molding apparatus provided with vertical dispenser 81. Consequently, the compression molding apparatus can be downsized.

Liquid resin 4 can be sucked into nozzle 64 from discharge port 64a by reversely rotating rotors 67 of measuring nozzle portions 65. Consequently, liquid resin 4 can be prevented from dripping from discharge port 64a.

In the structure shown in FIGS. 9 and 10, horizontal nozzle 23 described with reference to the first embodiment can be employed in place of horizontal nozzle 64. Further, resin supply portion 62 may be assembled into simultaneous transport mechanism 51 described with reference to the aforementioned embodiment.

(Another Cartridge Charge Portion Employing Air Cylinder as Pressure Mechanism)

Another cartridge charge portion employing an air cylinder is now described with reference to FIGS. 11 and 12. This cartridge charge portion is usable in place of cartridge charge portion 14 described with reference to FIGS. 4 and 5.

Figure 11:
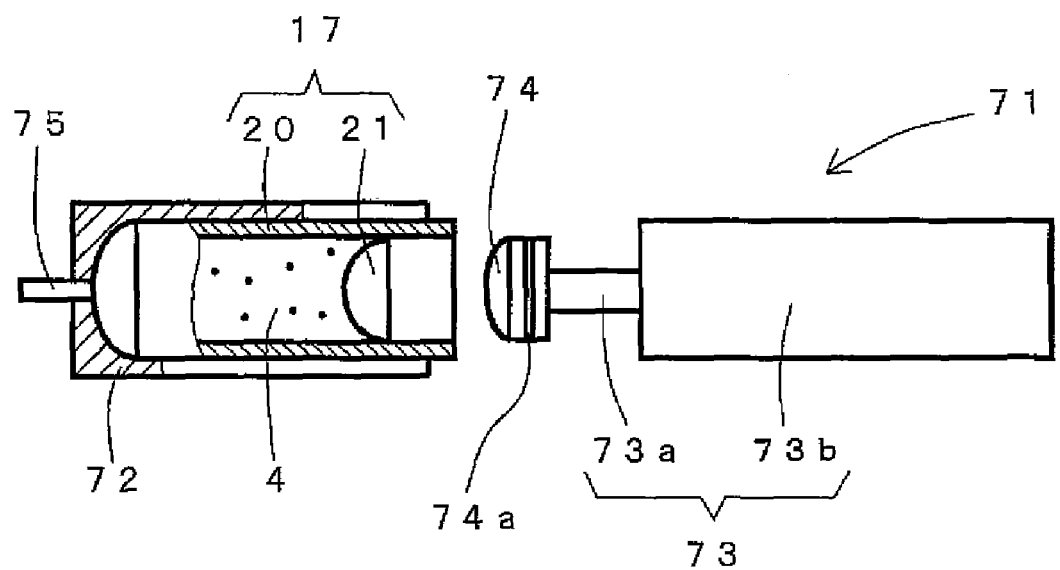
FIG. 11 is a sectional view showing a state before supply of liquid resin in a cartridge charge portion in the other embodiment.
Figure 12:
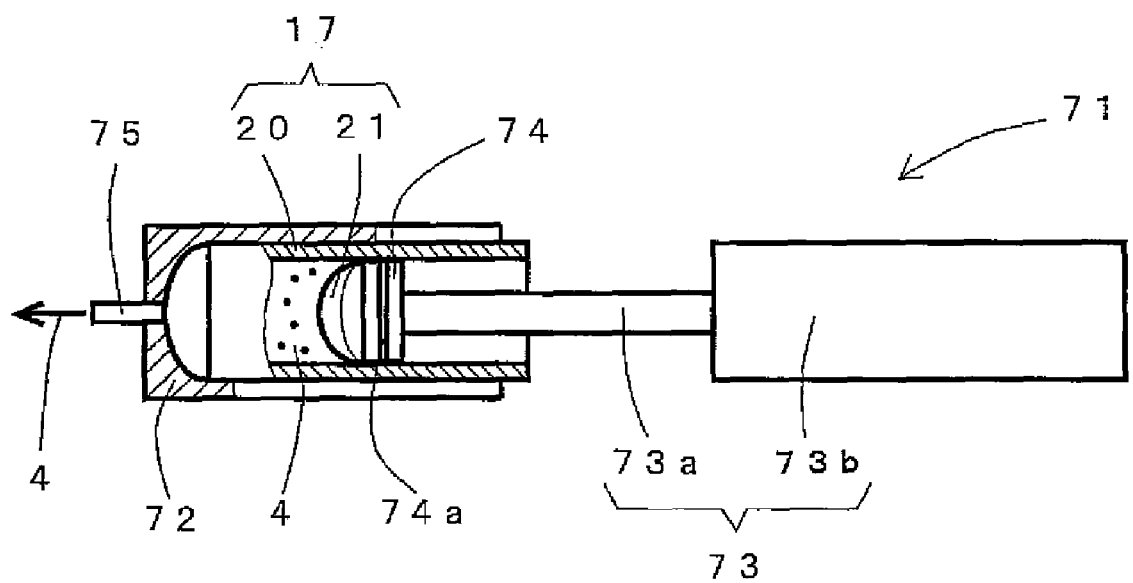
FIG. 12 is a sectional view showing a state after supply of the liquid resin in the cartridge charge portion in the other embodiment.

As shown in FIGS. 11 and 12, a liquid resin charge portion 71 includes a cartridge 17, a body 62 and an air cylinder 73 (pressure mechanism) pressing liquid resin 4 (base resin A or curing agent B) in cartridge 17.

Cartridge 17 includes a cartridge body 20 and a plunger 21 pressing liquid resin 4 in cartridge body 20. Air cylinder 73 has a piston 73a (rod), a pressure member 74 provided on the forward end of piston 73a and a driving portion 73b (cylinder portion) driving piston 73a provided with pressure member 74. A sealing member 74a, e.g., an O-ring for preventing the resin from aeration is provided on the peripheral surface of pressure member 74.

The aforementioned liquid resin charge portion 71 has two independent structures corresponding to the respective ones of base resin A and curing agent B in liquid resin 4.

First, cartridge 17 is mounted on cartridge body 20 in the aforementioned liquid resin charge portion 71. Then, driving portion 73b drives piston 73a and pressure member 74) whereby plunger 21 moves and liquid resin 4 in cartridge 17 is pressed. Thus, base resin A and curing agent B are supplied to the respective ones of two measuring portions 63 (24) provided on resin supply portion 72 (13) from a supply pipe 75 on the forward end of cartridge 17 through a transfer path 15 respectively.

In liquid resin charge portion 71 shown in FIGS. 9 and 10, therefore, sealing member 74a is provided around pressure member 74 for preventing the resin from aeration. Thus, air bubbles are prevented from mixing into liquid resin 4 supplied to resin supply mechanism 61 (5).

(Other Liquid Resin Charge Portions Employing Pneumatic Tanks as Pressure Mechanisms)

Other liquid resin charge portions employing pneumatic tanks (made of steel, for example) having pressure resistance as pressure mechanisms are now described with reference to FIGS. 13 to 17. The pneumatic tanks are made of steel, for example. These liquid resin charge portions are employable in place of the aforementioned cartridge charge portion 14 shown in FIGS. 4 and 5.

Figure 13:
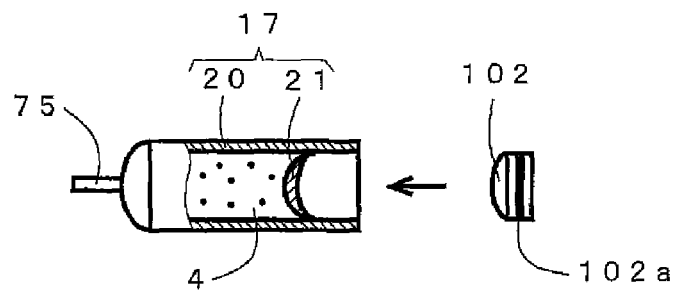
FIG. 13 is a sectional view showing a cartridge charged into the cartridge charge portion in the other embodiment.
Figure 14:
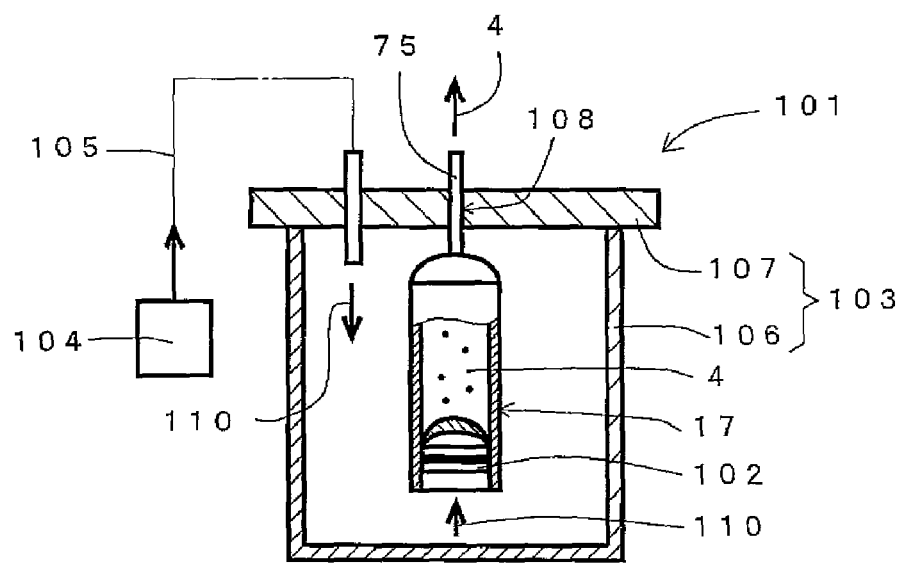
FIG. 14 is a sectional view showing another cartridge charge portion.
Figure 15:
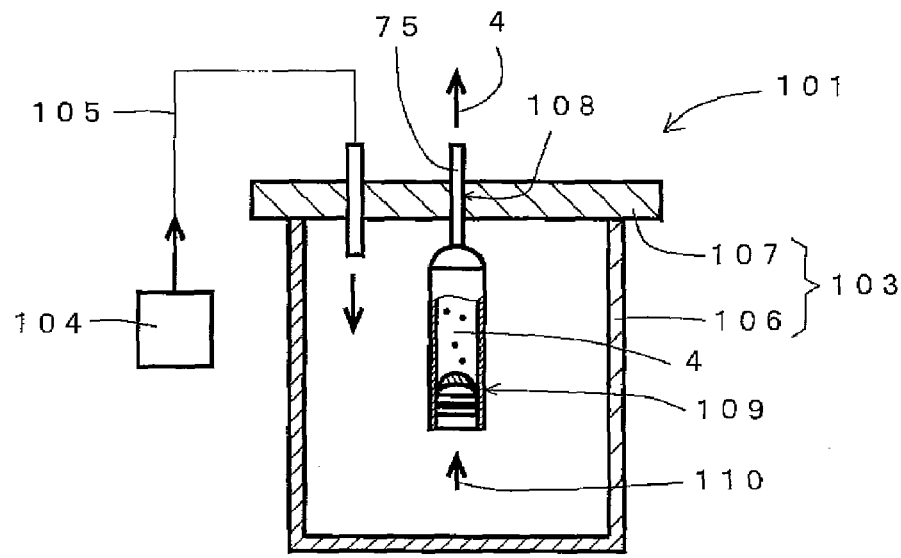
FIG. 15 is a sectional view showing still another cartridge charge portion.

A charge portion 101 for liquid resin 4 shown in FIGS. 13 to 15 includes a cartridge 17 shown in FIG. 13, a pressure member 102 pressing liquid resin 4 in cartridge 17 and a sealing member 102a (O-ring, for example) provided around pressure member 102 for preventing the resin from aeration. Charge portion 101 further includes a pneumatic tank 103 pressing pressure member 102 thereby pressing liquid resin 4 in cartridge 17 and applying pressure to liquid resin 4, a pressure mechanism 104 such as an air compressor pressurizing air 110 in pneumatic tank 103 and a pressure path 105 such as a pressure tube making pneumatic tank 103 and pressure mechanism 104 communicate with each other.

Cartridge 17 includes a cartridge body 20, a plunger 21 and a supply pipe 75 (communicatively connected to transfer path 15) provided on the forward end of cartridge body 20. Pneumatic tank 103 includes a tank body 106, a lid portion 107 and a supply pipe mount/dismount portion 108 provided on lid portion 107.

Supply pipe 75 is mounted on supply pipe mount/dismount portion 108. The space in pneumatic tank 103 can be sealed by mounting lid portion 107 on tank body 106. However, the space in pneumatic tank 103 communicates with pressure path 105 and supply pipe mount/dismount portion 108.

As shown in FIG. 14, supply pipe 75 shown in FIG. 13 is first mounted on supply pipe mount/dismount portion 108 of lid portion 107 while pressure member 102 is mounted on the side of cartridge body 20 closer to plunger 21. Then, lid portion 107 is mounted on tank body 106, and cartridge 107 is inserted into tank body 106 along with pressure member 102.

Then, air 110 serving as gas in pneumatic tank 103 is pressurized by pressure mechanism 104 through pressure path 105. Thus, air 110 integrally presses pressure member 102 and plunger 21. At this time liquid resin 4 in cartridge body 20 is pressed by plunger 21. Thus, liquid resin 4 is supplied from supply pipe 75 of cartridge 17 to the respective ones of two measuring portions 63 (24) of resin supply mechanism 61 (5) through transfer path 15.

As shown in FIG. 15, a small cartridge 109 smaller than cartridge 17 may be set in pneumatic tank 103, in place of cartridge 17 shown in FIGS. 13 and 14. Small cartridge 109 has a small cartridge body, a small plunger, a small pressure member and a supply pipe 75.

As understood from FIGS. 13 to 15, a cartridge having a different size and a cartridge different in volume or weight of liquid resin 4 can be employed according to circumstances when pneumatic tank 103 is employed as liquid resin charge portion 101.

Figure 16:
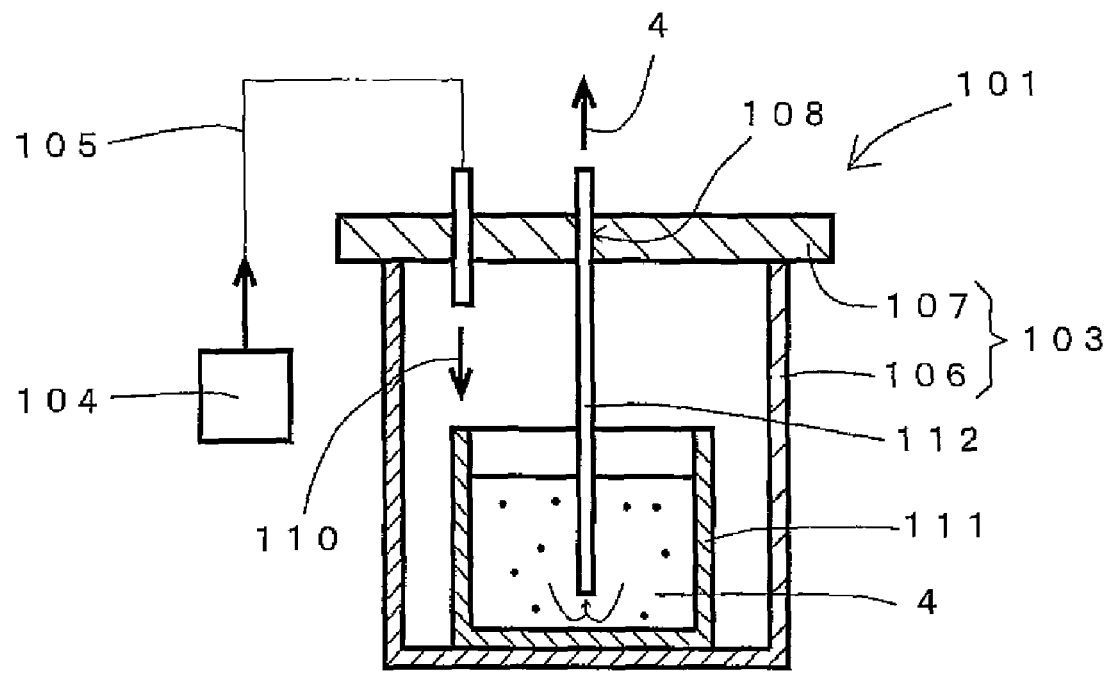
FIG. 16 is a sectional view showing a further cartridge charge portion.
Figure 17:
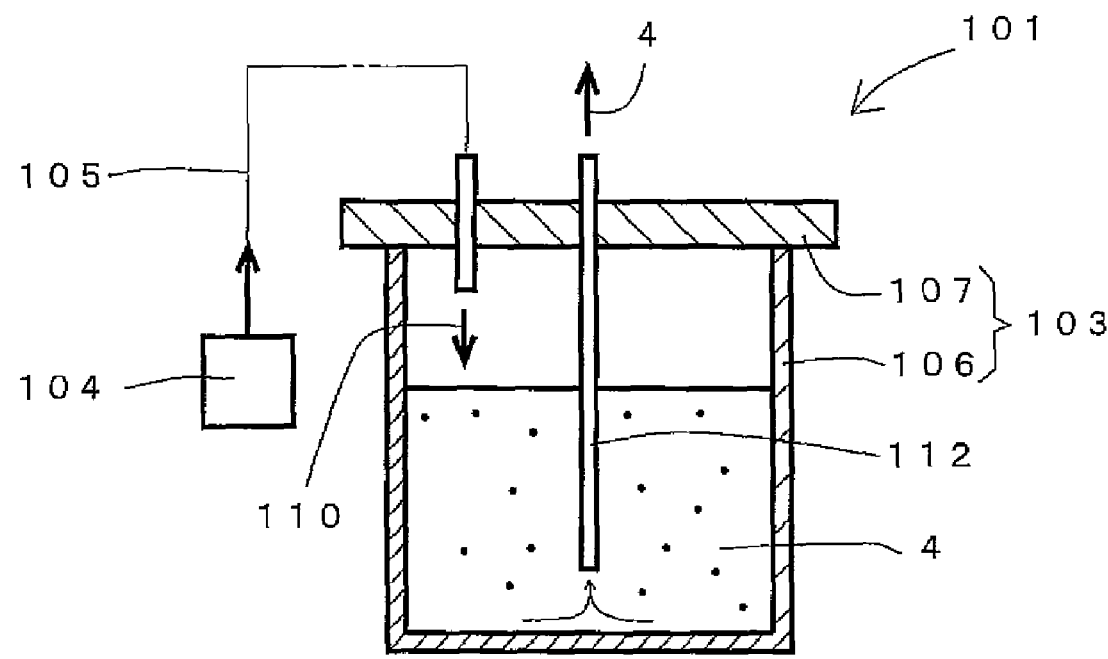
FIG. 17 is a sectional view showing a still further cartridge charge portion.
Figure 18:
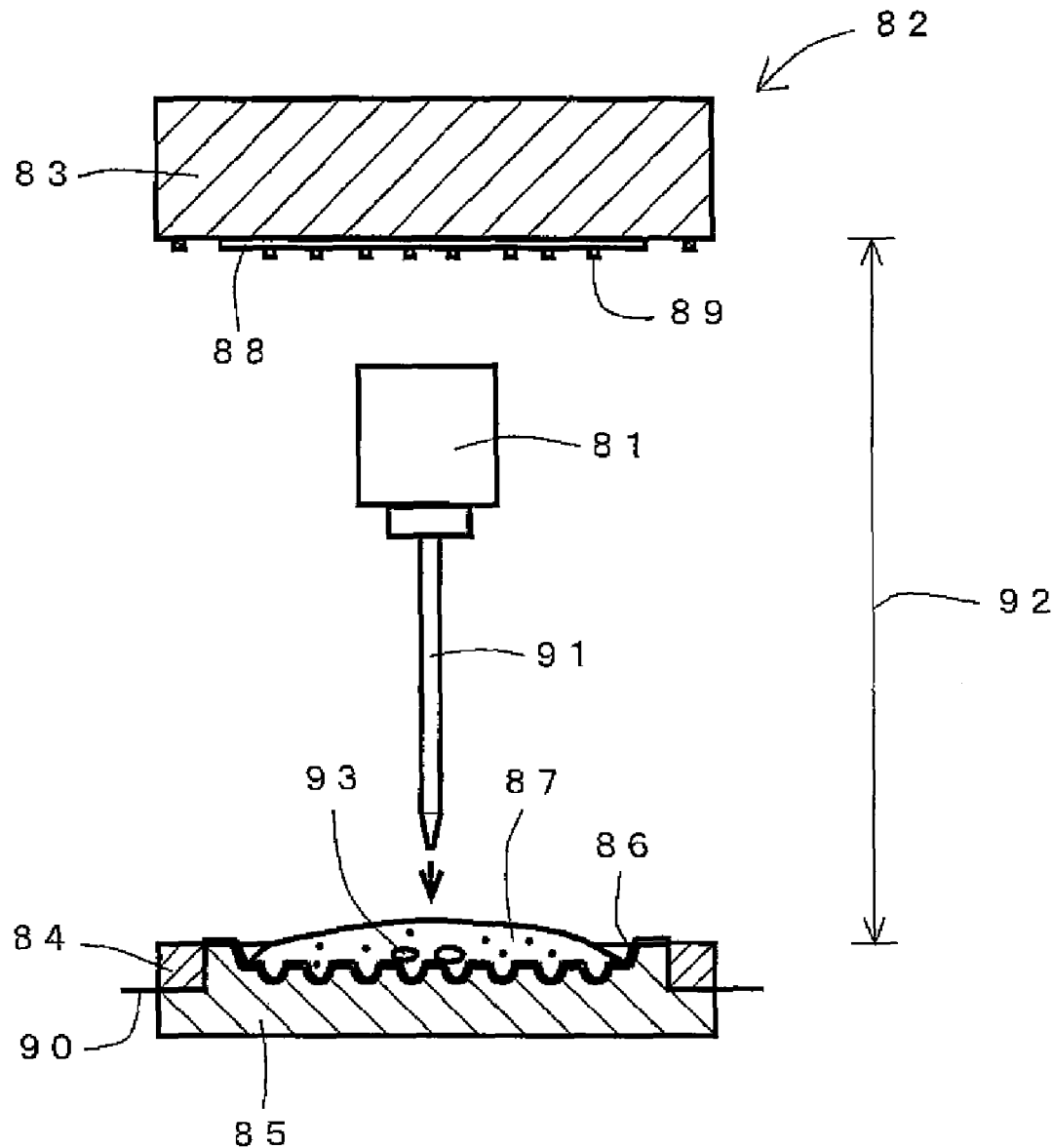
FIG. 18 is a sectional view schematically showing a conventional compression molding apparatus for electronic components.

Another liquid resin charge portion 10T shown in FIGS. 16 and 17 is now described.

The basic structure of liquid resin charge portion 101 employed in this embodiment is identical to the structure shown in FIGS. 13 to 15, and hence the same structures of these are denoted by the same reference signs.

As shown in FIG. 16, a container 111 storing liquid resin 4 is set in a pneumatic tank 103. Container 111 has an opening on the upper portion. Liquid resin 4 stored in container 11I and a space in a supply pipe mount/dismount portion 108 of a lid portion 107, i.e., a space in a transfer path 15 provided outside pneumatic tank 103 are connected with each other by a supply pipe 112 to communicate with each other.

When a pressure mechanism 104 pressurizes air 110 in pneumatic tank 103 so that the surface of liquid resin 4 stored in container 111 is pressed, therefore, liquid resin 4 is supplied to the respective ones of two measuring portions 63 (24) of a resin supply mechanism 61 (5) through supply pipe 112 and transfer path 15.

As shown in FIG. 17, such a structure that liquid resin 4 is directly stored in a tank body 106 may be employed. In this case, liquid resin 4 stored in tank body 106 and supply pipe mount/dismount portion 108, i.e., the space in transfer path 15 provided outside pneumatic tank 103 are connected with each other by supply pipe 112 to communicate with each other.

Therefore, when pressure mechanism 104 applies pressure to air 110 in pneumatic tank 103 so that the surface of liquid resin 4 stored in tank body 106 is pressed, liquid resin 4 is supplied to the respective ones of two measuring portions 63 (24) of resin supply mechanism 61 (5) through supply pipe 112 and transfer path 15.

Two pneumatic tanks 103 may be provided as liquid resin mount portions 101. In other words, the respective ones of two cartridges 17 and 109, the respective ones of two containers 111 and the respective ones of two tank bodies 106 may be provided to correspond to base resin A and curing agent B of liquid resin 4. Alternatively, two cartridges 17 and 109, two containers 111 and two tank bodies 106 may be provided on a single pneumatic tank 103 to correspond to the respective ones of base resin A and curing agent B. Further, a plurality of supply pipe mount/dismount portions 108 may be provided on a single pneumatic tank 103. In addition, gas such as nitrogen gas or carbon dioxide gas may be employed in place of air 110.

While mold assembly 3 having upper mold section 6, intermediate mold section 8 and lower mold section 7 is employed in each embodiment, a mold assembly having an upper mold section and a lower mold section may be employed.

While liquid resin 4 is supplied to general cavity 10 covered with mold releasing film 12 in each embodiment, the same may be supplied to general cavity 10 not covered with mold releasing film 12.

While two-part liquid resin 4 is employed in each embodiment, one-part liquid resin may be employed in the present invention. While transparent liquid resin 4 is employed in each embodiment, further, semitransparent liquid resin or opaque liquid resin may be employed in the present invention.

While silicone resin 4 is employed in each embodiment; in addition, another thermosetting resin such as epoxy resin, for example, may be employed. Further, thermoplastic resin may be employed in place of thermosetting resin in each embodiment.

While optical elements such as LED chips are resin-sealed in each embodiment, electronic components other than optical elements may be resin-sealed in the present invention.

Although the present invention has been described and illustrated in detail, it is clearly understood that the same is by way of illustration and example only and is not to be taken by way of limitation, the scope of the present invention being interpreted by the terms of the appended claims.

The invention claimed is:

1. A compression molding method for molding an electronic component, the method comprising the steps of:
    preparing an upper mold section, a lower mold section provided with a cavity, a nozzle including a spiral supply member having an internal spiral structure, a base resin, and a curing agent;
    supplying said base resin and said curing agent to said spiral structure;
    mixing said base resin and said curing agent as a liquid resin mixture in said spiral structure;
    inserting said nozzle to extend horizontally between said upper mold section and said lower mold section while said mold sections are separated;
    discharging said liquid resin from said nozzle into said cavity while the nozzle remains disposed horizontally so that said liquid resin falls from said nozzle into said cavity;
    dipping an electronic component loaded on a substrate mounted on said upper mold section in said liquid resin by closing said upper mold section and said lower mold section;
    curing said liquid resin while said electronic component is dipped therein; and
    opening said upper mold section and said lower mold section,
    wherein the discharge port of said nozzle moves above the bottom surface of said cavity in said discharging step.

2. The compression molding method for an electronic component according to claim 1, wherein
    a discharge port of said nozzle successively reciprocates a portion above a middle position of the bottom surface of said cavity and portions above the respective ones of a plurality of positions in the vicinity of the outer periphery of the bottom surface of said cavity in said discharging step.

3. The compression molding method for an electronic component according to claim 1, wherein
    a discharge port of said nozzle moves so as to draw a sigmoid locus in plan view above the bottom surface of said cavity in said discharging step.

4. The compression molding method for an electronic component according to claim 1, wherein
    said liquid resin includes light-transmitting two-part silicone resin.

5. The compression molding method for an electronic component according to claim 1, wherein
    said liquid resin is supplied to said cavity while said cavity is covered with a mold releasing film in said discharging step.

6. The compression molding method for an electronic component according to claim 1, wherein
    said substrate and said liquid resin are simultaneously inserted between said upper mold section and said lower mold section in said preparing step.

* * * * *

UNITED STATES PATENT AND TRADEMARK OFFICE
CERTIFICATE OF CORRECTION

PATENT NO. : 8,105,524 B2
APPLICATION NO. : 12/303504
DATED : January 31, 2012
INVENTOR(S) : Tetsuya Yamada et al.

It is certified that error appears in the above-identified patent and that said Letters Patent is hereby corrected as shown below:

ON THE TITLE PAGE:

At item (73), Assignee, change:

"(73) Assignee: Shin-Etsu Chemical Co., Ltd., Tokyo (JP)"

to

--(73) Assignees: Towa Corporation, Kyoto-Shi, Kyoto (JP); Shin-Etsu Chemical Co., Ltd., Tokyo (JP)--.

Signed and Sealed this
Third Day of July, 2012

David J. Kappos
*Director of the United States Patent and Trademark Office*